United States Patent
Darby et al.

(10) Patent No.: US 12,469,682 B1
(45) Date of Patent: Nov. 11, 2025

(54) ELECTRICAL DISCHARGE MACHINING PROCESSING FOR SEMICONDUCTOR WORKPIECE

(71) Applicant: Wolfspeed, Inc., Durham, NC (US)

(72) Inventors: Blake Leonardi Darby, Raleigh, NC (US); Devon Michael Diehl, Durham, NC (US)

(73) Assignee: WOLFSPEED, INC., Durham, NC (US)

( * ) Notice: Subject to any disclaimer, the term of this patent is extended or adjusted under 35 U.S.C. 154(b) by 0 days.

(21) Appl. No.: 18/662,033

(22) Filed: May 13, 2024

(51) Int. Cl.
| H01J 37/32 | (2006.01) |
| B23K 26/34 | (2014.01) |
| H01L 21/02 | (2006.01) |
| H01L 21/66 | (2006.01) |

(52) U.S. Cl.
CPC ........ *H01J 37/32348* (2013.01); *B23K 26/34* (2013.01); *H01L 21/02005* (2013.01); *H01L 22/12* (2013.01); *H01J 2237/336* (2013.01)

(58) Field of Classification Search
None
See application file for complete search history.

(56) References Cited

U.S. PATENT DOCUMENTS

2019/0295855 A1\* 9/2019 Ojha ............... H01L 21/306

OTHER PUBLICATIONS

Jeevamalar et al., "Die Sinking EDM Process Parameters: A Review", International Journal of Mechanical Engineering and Robotics Research, vol. 4, No. 1, Jan. 2015, pp. 315-326.
Zhu et al., "Electrical Discharge Machining of Semiconductor Materials: A Review", Journal of Materials Research and Technology, vol. 25, Jun. 2023, pp. 4354-4379.

\* cited by examiner

*Primary Examiner* — Hung K Vu
(74) *Attorney, Agent, or Firm* — Dority & Manning, P.A.

(57) ABSTRACT

An example method includes providing a wide bandgap semiconductor workpiece. The example method includes exposing the wide bandgap semiconductor workpiece to one or more electrical discharges from an electrical discharge machining (EDM) system to reduce a surface roughness of the wide bandgap semiconductor workpiece. Exposing the wide bandgap semiconductor workpiece to the one or more electrical discharges may include submerging a surface of the wide bandgap semiconductor workpiece in a dielectric fluid; positioning an electrode head relative to the surface such that a gap is defined between an end of the electrode head and the surface; and generating an electrical discharge across the gap to create a plasma zone within the gap such that a material is removed from the surface.

19 Claims, 14 Drawing Sheets

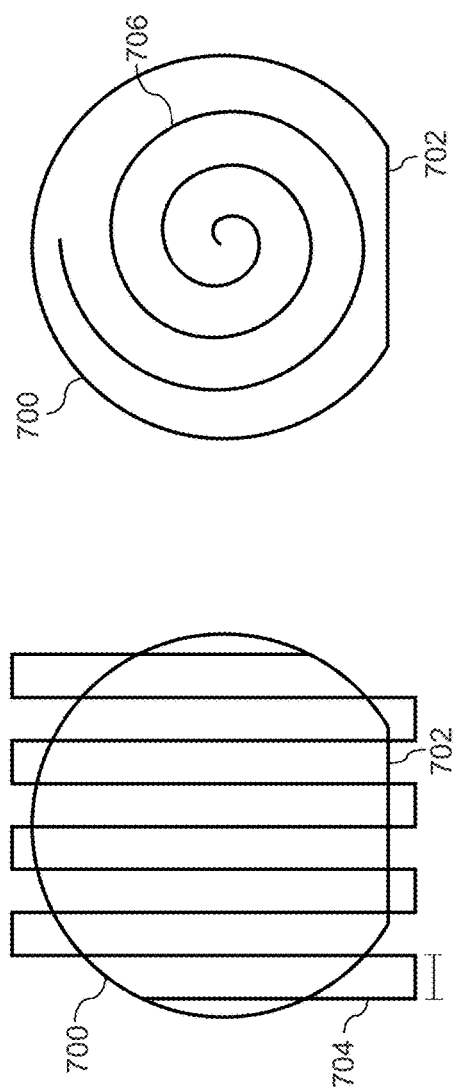
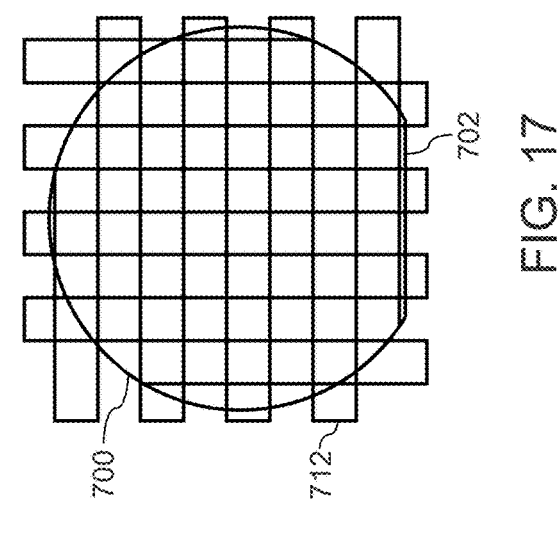
FIG. 13
FIG. 14
FIG. 15
FIG. 16
FIG. 17

ELECTRICAL DISCHARGE MACHINING PROCESSING FOR SEMICONDUCTOR WORKPIECE

FIELD

The present disclosure relates generally to semiconductor fabrication, and more particularly to surface processing of semiconductor workpieces, such as wide bandgap semiconductor workpieces, such as silicon carbide semiconductor workpieces.

BACKGROUND

Power semiconductor devices are used to carry large currents and support high voltages. A wide variety of power semiconductor devices are known in the art including, for example, transistors, diodes, thyristors, power modules, discrete power semiconductor packages, and other devices. For instance, example semiconductor devices may be transistor devices such as Metal Oxide Semiconductor Field Effect Transistors ("MOSFET"), bipolar junction transistors ("BJTs"), Insulated Gate Bipolar Transistors ("IGBT"), Gate Turn-Off Transistors ("GTO"), junction field effect transistors ("JFET"), high electron mobility transistors ("HEMT") and other devices. Example semiconductor devices may be diodes, such as Schottky diodes or other devices.

Power semiconductor devices may be packaged into various semiconductor device packages, such as discrete semiconductor device packages and power modules. Power modules may include one or more power devices and other circuit components and can be used, for instance, to dynamically switch large amounts of power through various components, such as motors, inverters, generators, and the like.

Semiconductor devices may be fabricated from wide bandgap semiconductor materials, such as silicon carbide and/or Group III nitride-based semiconductor materials. The fabrication process for power semiconductor devices may require processing of wide bandgap semiconductor wafers, such as silicon carbide semiconductor wafers.

SUMMARY

Aspects and advantages of embodiments of the present disclosure will be set forth in part in the following description, or may be learned from the description, or may be learned through practice of the embodiments.

In an aspect, the present disclosure provides an example method. In some implementations, the example method includes providing a wide bandgap semiconductor workpiece. In some implementations, the example method includes exposing the wide bandgap semiconductor workpiece to one or more electrical discharges from an electrical discharge machining (EDM) system to reduce a surface roughness of the wide bandgap semiconductor workpiece.

In an aspect, the present disclosure provides an example method of processing a surface of a semiconductor material. In some implementations, the example method includes obtaining data indicative of a workpiece property. In some implementations, the example method includes determining one or more electrical discharge machining (EDM) system parameters based on the data indicative of the workpiece property. In some implementations, the example method includes removing semiconductor material from the surface using an EDM system based at least in part on the EDM system parameters.

In an aspect, the present disclosure provides an example method of processing a semiconductor workpiece. In some implementations, the example method includes submerging a surface of a semiconductor workpiece in a dielectric fluid. In some implementations, the example method includes positioning an electrode head of an electric discharge machining (EDM) system relative to the surface such that a gap is defined between an end of the electrode head and the surface. In some implementations, the example method includes generating an electrical discharge across the gap to create a plasma zone within the gap such that semiconductor material is removed from the surface.

In an aspect, the present disclosure provides an example system for processing a surface of a semiconductor material. In some implementations, the example system includes an electrical discharge machining (EDM) system. In some implementations, the example electrical discharge machining (EDM) system includes a tank operable to contain a dielectric fluid and a semiconductor workpiece submerged within the dielectric fluid. In some implementations, the example electrical discharge machining (EDM) system includes an electrode head operable to be positioned relative to a surface of the semiconductor workpiece such that a gap is defined between an end of the electrode head and the surface. In some implementations, when a bias voltage is supplied to the electrode head, an electrical discharge is generated across the gap and a plasma zone is created within the gap that removes material from the surface. In some implementations, the example electrical discharge machining (EDM) system includes a translation stage operable to impart relative motion between the electrode head and the surface of the semiconductor workpiece.

These and other features, aspects and advantages of various embodiments will become better understood with reference to the following description and appended claims. The accompanying drawings, which are incorporated in and constitute a part of this specification, illustrate embodiments of the present disclosure and, together with the description, explain the related principles.

BRIEF DESCRIPTION OF THE DRAWINGS

Detailed discussion of embodiments directed to one of ordinary skill in the art are set forth in the specification, which refers to the appended figures, in which:

FIGS. 13-19 depict example scan patterns for a laser-based surface processing operation according to examples of the present disclosure.

DETAILED DESCRIPTION

Figure 1:
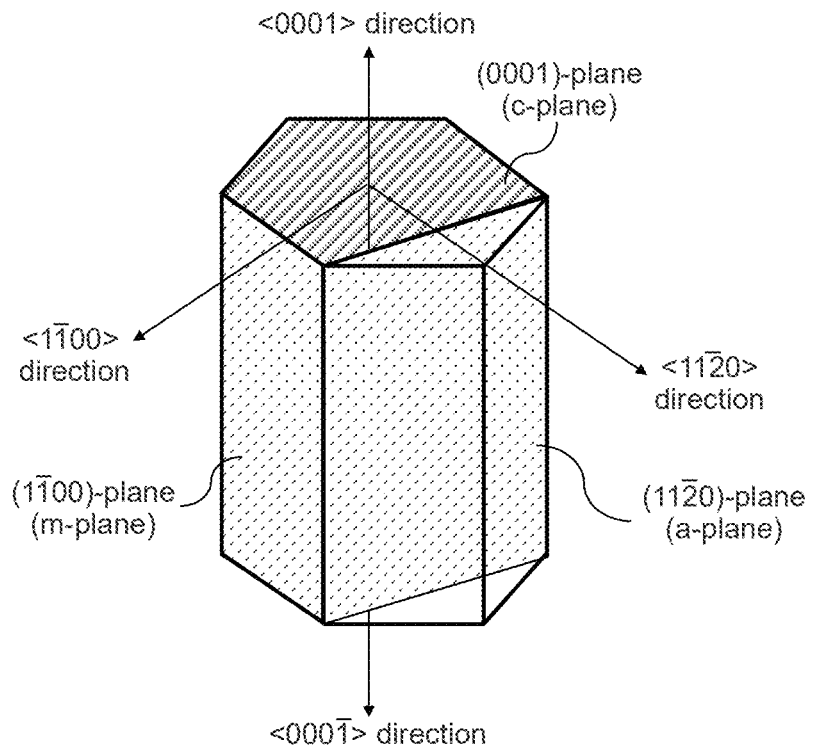
FIG. 1 is a first perspective view crystal plane diagram showing the coordinate system for a hexagonal crystal such as 4H—SiC.

Reference now will be made in detail to embodiments, one or more examples of which are illustrated in the drawings. Each example is provided by way of explanation of the embodiments, not limitation of the present disclosure. In fact, it will be apparent to those skilled in the art that various modifications and variations can be made to the embodiments without departing from the scope or spirit of the present disclosure. For instance, features illustrated or described as part of one embodiment can be used with another embodiment to yield a still further embodiment. Thus, it is intended that aspects of the present disclosure cover such modifications and variations.

Power semiconductor devices are often fabricated from wide bandgap semiconductor materials, such as silicon carbide or Group III-nitride-based semiconductor materials (e.g., gallium nitride). Herein, a wide bandgap semiconductor material refers to a semiconductor material having a bandgap greater than 1.40 eV. Aspects of the present disclosure are discussed with reference to silicon carbide-based semiconductor structures as wide bandgap semiconductor structures. Those of ordinary skill in the art, using the disclosures provided herein, will understand that the power semiconductor devices according to example embodiments of the present disclosure may be used with any semiconductor material, such as other wide bandgap semiconductor materials and other semiconductor materials (e.g., silicon), without deviating from the scope of the present disclosure. Example wide bandgap semiconductor materials include silicon carbide and the Group III-nitrides.

Power semiconductor devices may be fabricated using epitaxial layers formed on a semiconductor workpiece, such as a silicon carbide semiconductor wafer. Aspects of the present disclosure are discussed with reference to a semiconductor workpiece that is a semiconductor wafer that includes silicon carbide ("silicon carbide semiconductor wafer") for purposes of illustration and discussion. Those of ordinary skill in the art, using the disclosures provided herein, will understand that aspects of the present disclosure can be used with other semiconductor workpieces, such as other wide bandgap semiconductor workpieces. Other semiconductor workpieces may include carrier substrates, ingots, boules, polycrystalline substrates, monocrystalline substrates, bulk materials having a thickness of greater than 1 mm, such as greater than about 5 mm, such as greater than about 10 millimeters, such as greater than about 20 millimeters, such as greater than about 50 millimeters, such as greater than about 100 millimeters, such as greater than about 200 millimeters, etc.

In some examples, the semiconductor workpiece includes silicon carbide crystalline material. The silicon carbide crystalline material may have a 4H crystal structure, 6H crystal structure, or other crystal structure. The semiconductor workpiece can be an on-axis workpiece (e.g., end face parallel to the (0001) plane) or an off-axis workpiece (e.g., end face non-parallel to the (0001) plane).

Aspects of the present disclosure may make reference to a surface of the semiconductor workpiece. In some examples, the surface of the workpiece may be, for instance, a silicon face of the workpiece. In some examples, the surface of the workpiece may be, for instance, a carbon face of the workpiece.

An ingot or boule refers to a large portion of semiconductor material used in forming semiconductor substrates, commonly semiconductor wafers. A boule may be part of an epitaxially grown crystalline semiconductor material, for example, a wide bandgap semiconductor material. Specifically, in some examples, a boule may include a large portion of epitaxially grown silicon carbide (e.g., 4H silicon carbide) or Group III-nitride. A substrate or semiconductor wafer may be formed from a portion of semiconductor material removed from a boule. The terms "ingot" and "boule" may be used interchangeably in the present disclosure.

In some examples, a semiconductor wafer may be a solid semiconductor workpiece upon which semiconductor device fabrication may be implemented. A semiconductor wafer may be a homogenous material, such as silicon carbide, and may provide mechanical support for the formation and/or carrying of additional semiconductor layers (e.g., epitaxial layers), metallization layers, and other layers to form one or more semiconductor devices. In some examples, a semiconductor wafer may have a thickness in a range of about 0.5 microns to about 1000 microns, or greater.

A semiconductor wafer may be characterized by a plurality of surfaces. For example, a semiconductor wafer may have a "first major surface" and a "second major surface." The first major surface may be generally opposite the second major surface. The first and second major surfaces may be generally parallel to one another. A semiconductor wafer may also have a "side surface" corresponding to a surface extending between the two major surfaces. For example, the side surface may extend between the first major surface and the second major surface.

Power semiconductor device fabrication processes may include surface processing operations that are performed on the silicon carbide semiconductor wafer to prepare one or more surfaces of the silicon carbide semiconductor wafer for later processing steps, such as surface implantation, formation of epitaxial layers, metallization, etc. Example surface processing operations may include grinding operations, lapping operations, and polishing operations. Methods for surface processing of semiconductor wafers in semiconductor manufacturing may include grinding, lapping, and/or polishing the rough surfaces until a sufficient smoothness and/or thickness is achieved.

Grinding is a material removal process that is used to remove material from the semiconductor wafer. Grinding may be used to reduce a thickness of a semiconductor wafer. Grinding typically involves exposing the semiconductor wafer to an abrasive-containing surface, such as grinding teeth on a grind wheel. Grinding may remove material of the semiconductor wafer through engagement with the abrasive surface.

Lapping is a precision finishing process that uses a loose abrasive in slurry form. The slurry typically includes coarser particles (e.g., the largest dimension of the particles being greater than about 100 microns) to remove material from the semiconductor wafer. Lapping typically does not include engaging the semiconductor wafer with an abrasive-containing surface on the lapping tool (e.g., a wheel or disc having an abrasive-containing surface). Instead, the semiconductor wafer typically comes into contact with a lapping plate or a tile usually made of metal. Lapping typically provides better planarization of the semiconductor wafer relative to grinding.

Polishing is a process to remove imperfections and create a very smooth surface with a low surface roughness. Polishing may be performed using a slurry and a polishing pad. The slurry typically includes finer particles relative to lapping, but coarser particles relative to chemical mechanical planarization (CMP). Polishing typically provides better planarization of the semiconductor wafer relative to grinding.

CMP is a type of fine or ultrafine polishing, typically used to produce a smoother surface ready, for instance, for epitaxial growth of layers on the semiconductor wafer. CMP may be performed chemically and/or mechanically to remove imperfections and to create a very smooth and flat surface with low surface roughness. CMP typically involves changing the material of the semiconductor through a chemical process (e.g., oxidation) and removing the new material from the semiconductor wafer through abrasive contact with a slurry and/or other abrasive surface or polishing pad (e.g., oxide removal). In CMP, the abrasive elements in the slurry typically remove the product of the chemical process and do not remove the bulk material of the semiconductor wafer, often leaving very low subsurface damage.

Current methods for fabricating power semiconductor devices from semiconductor material boules may incur significant material losses and consumable tool losses and costs due to the structural properties of crystalline boules and current methods of separating or fracturing substrates or wafers from a boule. Methods for fabricating power semiconductor devices include forming a crystalline material boule, such as a silicon carbide boule, and separating portions of the boule to form substrates, such as silicon carbide semiconductor wafers. In some instances, boules may be formed to include doped regions with dopants within the crystalline material boule.

Methods for forming semiconductor wafers from boules may include, for instance, cutting thin layers (e.g., wafers) from the boule using wire saws. Another example removal process for forming semiconductor wafers from boules may include a laser-based removal process. Laser-based removal processes may include providing subsurface laser damage patterns to a boule to form weakened areas in the boule. Portions may then be separated from the boule along the weakened areas to produce semiconductor wafers. Separation processes may include, for example, ultrasonic fracturing, mechanical force fracturing, or other fracturing methods.

The separating (e.g., fracturing) process may produce a rough and uneven surface on both the boule and the crystalline material substrates separated from the boule. For instance, in a laser-based removal process, laser strength, depth, weakened area proximity to other weakened areas, and laser power may contribute to the formation of residual cracks and defects protruding outward from the weakened areas which, in turn, create the rough surface of the boule and the semiconductor wafers removed from the boules.

Semiconductor devices and device manufacturing may require smooth surfaces on a semiconductor workpiece. Accordingly, in some cases, before continuing with further separations of the boule or further manufacturing with the semiconductor workpiece, rough surface(s) may need to be subjected to surface processing operations. For instance, in some examples, the surface of the boule may be smoothed to allow for the formation of subsequent laser damage regions in the boule. Otherwise, a rough surface on the boule may lead to undesirable reflection/refraction of one or more laser(s) used during formation of the subsurface laser damage regions for removal of subsequent semiconductor wafers. Methods for surface processing of boules and substates (e.g., semiconductor wafers) in semiconductor manufacturing may include grinding, lapping, and/or polishing the rough surfaces until sufficient smoothness is achieved.

In some instances, several grinding processes and/or other surface processing operations are performed to achieve sufficient smoothness. For instance, a coarse grinding process may reduce substantial irregularities or impurities and reduce wafer thickness, and a fine grinding process may finalize the surface and achieve sufficient smoothness for further fabrication processes (e.g., lapping and/or polishing).

Grinding methods may incur substantial time, material, and consumable tool loss and cost due to the structural properties of the crystalline materials used in semiconductor devices and the smoothness requirements of semiconductor devices. Materials used in wide bandgap semiconductor devices, such as, for example, silicon carbide, have extreme rigidity and strength requiring expensive tools (e.g., with diamond abrasive elements) that are rapidly consumed. The grinding process also results in material losses from grinding away potentially usable material to provide a sufficiently smooth surface for semiconductor device manufacturing.

Aspects of the present disclosure are directed to using an electrical discharge machining (EDM) system for processing boules, substrates (e.g., semiconductor wafers), or any semiconductor workpieces. For instance, aspects of the present disclosure are directed to a method for processing wide bandgap semiconductor workpieces including providing a wide bandgap semiconductor workpiece and exposing the wide bandgap semiconductor workpiece to one or more electrical discharges from the EDM system to reduce the surface roughness of the wide bandgap semiconductor workpiece.

In some examples, exposing the wide bandgap semiconductor workpiece to one or more electrical discharges includes at least partially submerging a surface of the wide bandgap semiconductor workpiece in a dielectric fluid. In one example, the dielectric fluid is an oil, kerosene, paraffin, white spirit, deionized water, or similar fluid. In some examples, the dielectric fluid may have a conductivity in a range of about 0.1 uS/cm to about 1 uS/cm. Exposing the wide bandgap semiconductor workpiece to one or more electrical discharges further includes positioning an electrode head relative to the surface such that a gap is defined between an end of the electrode head and the surface. A potential difference is then applied between the electrode head and the wide bandgap semiconductor workpiece. Thereafter, an electrical discharge is generated across the gap to create a plasma zone within the gap such that the material is removed from the surface. Such material removal reduces the surface roughness of the surface of the wide bandgap semiconductor workpiece being processed by the EDM system.

In some examples, the wide bandgap semiconductor workpiece may be a semiconductor wafer removed from a semiconductor boule. In such examples, the semiconductor wafer is removed from a portion of the boule using a removal process before the semiconductor wafer is exposed to the one or more electrical discharges. For example, in one example, a laser-based removal process is used. Specifically, the laser-based removal process includes inducing a subsurface laser damage region in the semiconductor boule and separating the semiconductor wafer from the boule along the subsurface laser damage region. In other examples, the wide bandgap semiconductor workpiece may be the boule from which the semiconductor wafer has been removed.

Exposing the wide bandgap semiconductor workpiece to the one or more electrical discharges results in a surface having a surface roughness Ra in a range of about 120 nm to about 65 microns. For example, the one or more electrical discharges may remove material from the surface and produce a surface with a surface roughness Ra between about 120 nm and about 65 microns, such as between about 200 nm and 10 microns, such as between about 500 nm and 1 micron.

In addition, after the material is removed, a thickness of the semiconductor workpiece is reduced by about 25 microns to about 100 microns. For example the one or more electrical discharges may reduce the thickness of the semiconductor workpiece by about 25 microns to about 100 microns, such as by about 25 microns to about 80 microns, such as by about 40 microns to about 60 microns, or the like.

Aspects of the present disclosure refer to and/or claim a "surface roughness" of a surface. As used herein, unless otherwise specifically noted, the surface roughness is measured as "areal average roughness" Sa. When the present disclosure or claims refer to a surface having a surface roughness within a range of values, a surface has a surface roughness in the range of values if any 1 millimeter by 1 millimeter area on the surface includes a surface roughness Sa within the specified range of values or if any 1 millimeter by 1 millimeter area on the surface includes a surface roughness Sz (maximum height) within the specified range of values.

As an example, a surface has a surface roughness in a range of 0.5 nm to 180 nm if any 1 millimeter×1 millimeter area on the surface has a surface roughness Sa in the range of 0.5 nanometers to 180 nanometers or if any 1 millimeter×1 millimeter area on the surface has a surface roughness Sz in the range of 0.5 nanometers to 180 nanometers. For the sake of clarity, it is not required that the entire surface have the surface roughness in the specified range of values. Only a single 1 millimeter×1 millimeter area on the surface is required to have a surface roughness in the specified range of values (e.g., either Sa or Sz) for the surface to be considered to have a surface roughness in the specified range of values.

When exposing the wide bandgap semiconductor workpiece to the one or more electrical discharges, relative motion may be imparted between the wide bandgap semiconductor workpiece and the electrode head of the EDM system. It should be appreciated that both moving the electrode head relative to the workpiece and moving the workpiece relative to the electrode head may fall within the scope of the present disclosure.

During EDM-based surface processing operation according to examples of the present disclosure, the electrode head may, for example, scan at least 85% of a surface of the semiconductor workpiece through relative motion between the electrode head and the semiconductor workpiece, such as at least 95% of the surface, such as at least 99% of the surface. The surface may be scanned by the electrode head in one or more passes.

The surface may be scanned by the electrode head in one or more passes. Each pass of the laser may have a scan dimension representative of a dimension of the electrode head on the surface. The scan dimension may be, for instance, in the range of about 10 microns to about 25 millimeters, such as about 500 microns to about 25 millimeters, such as about 1 millimeter to about 25 millimeters, such as about 1 millimeter to about 10 millimeters. In some examples, there may be a distance between passes of each electrode head. The distance between each scan or pass may be, for instance, in a range of about 0 millimeters to about 1 millimeter, such as about 0 millimeters to about 500 microns. In some examples, there may be no distance between passes of each electrode head. In some examples, there may be an overlap between scans or passes of the electrode head on the surface. In some examples, there may be about 0% to about 50% overlap of the scan dimension between passes of each electrode head.

The electrode head may scan the surface in any suitable pattern. Example electrode head scan patterns are provided in FIGS. 13-19 below.

In some examples, the EDM-based surface processing operation may be performed in multiple passes of the electrode head over the same position of the workpiece to achieve desired materials removal or thickness reduction in the surface.

In some examples, various EDM system parameters associated with the EDM process(es) may be adjusted, changed, or tuned depending on the materials and other parameters of the semiconductor workpiece. In some examples, to adjust the one or more EDM system parameters, data may be obtained regarding the surface and/or material of the semiconductor workpiece before, during, and/or after the EDM process. The data may include, for instance, workpiece property data that provides data associated with a surface of the workpiece (e.g., topography, roughness), subsurface regions of the workpiece, optical properties of the workpiece, temperature of the workpiece, doping level of the workpiece, polytype of the workpiece (e.g., 4H, 6H), or other parameters. For instance, the workpiece property data may be obtained using one or more sensors. In some examples, the workpiece property data may include data associated with a surface topography of the workpiece. In some examples, the workpiece property data may include an image of the exposed surface obtained using an optical sensor or image capture device. In some examples, a scan of the exposed surface may be obtained using one or more surface measurement lasers or other optical devices. In some examples, an image may be captured of the exposed surface and analyzed using computer image processing techniques (e.g., classifier models, such as machine-learned classifier models) to determine data indicative of workpiece properties, such as the presence of anomalies, defects, roughness, topography, optical properties, etc.

In some embodiments, the EDM system parameters may be specified as a function of position on the surface of the semiconductor workpiece (e.g., the parameters are modified and changed based on position of the one or more lasers on the exposed surface). The EDM system parameters may be adjusted and/or selected as a function of position on the surface. For instance, the EDM system parameters at a first position with a high surface roughness may be different from the EDM system parameters at a second position with less surface roughness.

Aspects of the present disclosure are additionally directed to systems for implementing the methods discussed herein. For instance, aspects of the present disclosure relate to a system for processing a surface of a semiconductor material using an EDM system. The EDM system, in turn, includes a tank operable to contain a dielectric fluid (e.g., oil, kerosene, paraffin, white spirit, deionized water, or similar dielectric fluid) in which the semiconductor workpiece (e.g., boule, substrate, wafer, etc.) is submerged. Furthermore, the EDM system includes an electrode head operable to be positioned relative to a surface of the semiconductor workpiece such that a gap is defined between an end of the electrode head and the surface. As such, when a bias voltage is supplied to the electrode head, an electrical discharge is generated across the gap and a plasma zone is created within the gap that removes material from the surface. Additionally, at least one translation stage may impart relative motion (e.g., linear and/or rotational motion) between the electrode head and the semiconductor workpiece. In some embodiments, the translation stage may move the electrode head and/or the workpiece relative to one another.

Additionally, in some examples, the system may include at least one sensor and a controller. The sensor(s) may be operable to obtain data associated with one or more workpiece properties. For instance, the sensor may be an optical sensor, image capture device, or one or more surface measurement lasers. The sensor(s) may be used to determine, for example, a surface topography of the surface. The controller may receive data from the at least one sensor and determine one or more EDM system parameters based on the workpiece property data. The controller may control the EDM system to remove the material from the surface of the semiconductor workpiece based, at least in part, on the EDM system parameters. As an example, the EDM system parameters may be specified as a function of position on the surface. The EDM system parameters may include, for instance, the duration and/or current of the electrical pulse supplied to the electrode head, etc. In some embodiments, the controller may be additionally configured to operate the translation stage to impart relative motion between the electrode head and the surface.

Aspects of the present disclosure provide a number of technical effects and benefits. For instance, aspects of the present disclosure allow for surface processing of semiconductor material surfaces without the use of traditional consumable abrasive tools and materials through EDM technologies. More specifically, aspects of the present disclosure allow for surface processing of semiconductor material surfaces using one or more electrode heads submerged in a dielectric fluid that are consumed at a far slower rate than conventional abrasive materials and therefore considerably reduce the manufacturing cost and time of semiconductor devices with high material strength and rigidity, such as silicon carbide. Additionally, operational costs of surface processing operations and methods using slowly consumed electrode heads do not grow in tandem with operational growth as with the use of conventional abrasive materials. Rather, operation costs may remain linear or largely stagnant due to the slow rate of electrode head deterioration in EDM processes. As another example, the use of EDM technologies for smoothing semiconductor material surfaces reduces the material lost due to manufacturing defects brought on during traditional surface smoothing practices. For instance, surface processing operations that use grinding may damage otherwise healthy portions of boules or substrates and create a loss of the boule or substrate entirely or may result in additional material lost to the surface processing operation to correct the damage.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present disclosure. As used herein, the term "and/or" includes any and all combinations of one or more of the associated listed items.

The terminology used herein is for the purpose of describing particular embodiments only and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

It will be understood that when an element such as a layer, structure, region, or substrate is referred to as being "on" or extending "onto" another element, it may be directly on or extend directly onto the other element or intervening elements may also be present and may be only partially on the other element. In contrast, when an element is referred to as being "directly on" or extending "directly onto" another element, there are no intervening elements present, and may be partially directly on the other element. It will also be understood that when an element is referred to as being "connected" or "coupled" to another element, it may be directly connected or coupled to the other element or intervening elements may be present. In contrast, when an element is referred to as being "directly connected" or "directly coupled" to another element, there are no intervening elements present.

As used herein, a first structure "at least partially overlaps" or is "overlapping" a second structure if an axis that is perpendicular to a major surface of the first structure passes through both the first structure and the second structure. A "peripheral portion" of a structure includes regions of a structure that are closer to a perimeter of a surface of the structure relative to a geometric center of the surface of the structure. A "center portion" of the structure includes regions of the structure that are closer to a geometric center of the surface of the structure relative to a perimeter of the surface. "Generally perpendicular" means within 15 degrees of perpendicular. "Generally parallel" means within 15 degrees of parallel.

Relative terms such as "below" or "above" or "upper" or "lower" or "horizontal" or "lateral" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the disclosure are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Similarly, it will be understood that variations in the dimensions are to be expected based on standard deviations in manufacturing procedures. As used herein, "approximately" or "about" includes values within 10% of the nominal value.

Like numbers refer to like elements throughout. Thus, the same or similar numbers may be described with reference to other drawings even if they are neither mentioned nor described in the corresponding drawing. Also, elements that are not denoted by reference numbers may be described with reference to other drawings.

Some embodiments of the invention are described with reference to semiconductor layers and/or regions which are characterized as having a conductivity type such as n type or p type, which refers to the majority carrier concentration in the layer and/or region. Thus, n type material has a majority equilibrium concentration of negatively charged electrons, while p type material has a majority equilibrium concentration of positively charged holes. Some material may be designated with a "+" or "−" (as in n+, n−, p+, p−, n++, n−−, p++, p−−, or the like), to indicate a relatively larger ("+") or smaller ("−") concentration of majority carriers compared to another layer or region. However, such notation does not imply the existence of a particular concentration of majority or minority carriers in a layer or region.

In the drawings and specification, there have been disclosed typical embodiments and, although specific terms are employed, they are used in a generic and descriptive sense only and not for purposes of limitation of the scope set forth in the following claims.

FIG. 1 is a first perspective view crystal plane diagram showing the coordinate system for a hexagonal crystal such as 4H-silicon carbide ("SiC"), in which the c-plane (0001) is perpendicular to both the m-plane (1$\bar{1}$00) and the a-plane (11$\bar{2}$0). The c-plane is perpendicular to the <0001> direction. The m-plane (1$\bar{1}$00) is perpendicular to the <1$\bar{1}$00> direction. The a-plane (11$\bar{2}$0) is perpendicular to the <11$\bar{2}$0> direction. The <000$\bar{1}$> direction is opposite the <0001> direction.

Figure 2:
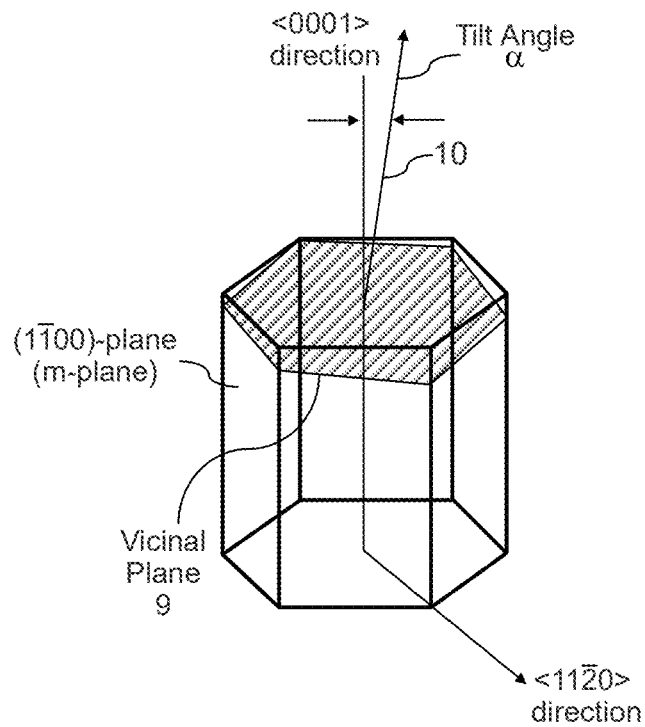
FIG. 2 is a second perspective view crystal plane diagram for a hexagonal crystal, illustrating a vicinal plane that is non-parallel to the c-plane.

FIG. 2 is a second perspective view crystal plane diagram for a hexagonal crystal, illustrating a vicinal plane 9 that is non-parallel to the c-plane, wherein a vector 10 (which is normal to the vicinal plane 9) is tilted away from the <0001> direction by a tilt angle α, with the tilt angle α being inclined (slightly) toward the <11$\bar{2}$0> direction.

Figure 3A:
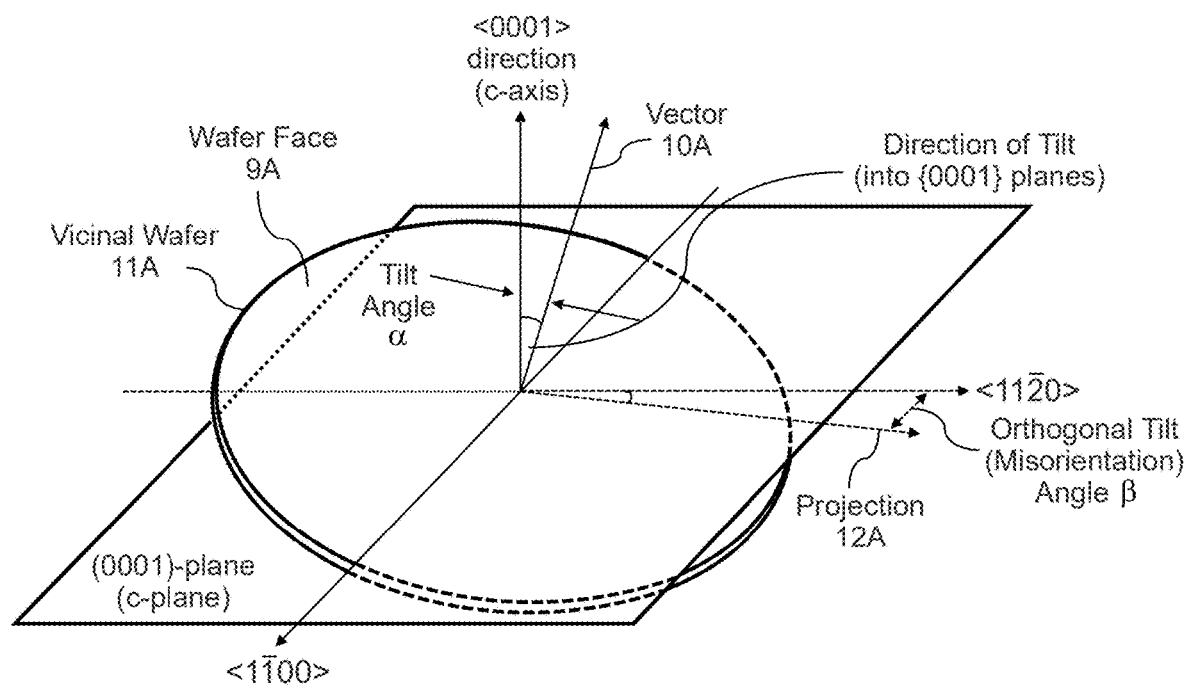
FIG. 3A is a perspective view wafer orientation diagram showing the orientation of a vicinal wafer relative to the c-plane.

FIG. 3A is a perspective view of a wafer orientation diagram showing the orientation of a vicinal wafer 11A relative to the c-plane (0001), in which a vector 10A (which is normal to the wafer face 9A) is tilted away from the <0001> direction by a tilt angle α. An orthogonal tilt (or misorientation angle) β may span between the <11$\bar{2}$0> direction and the projection of vector 10A onto the c-plane.

Figure 3B:
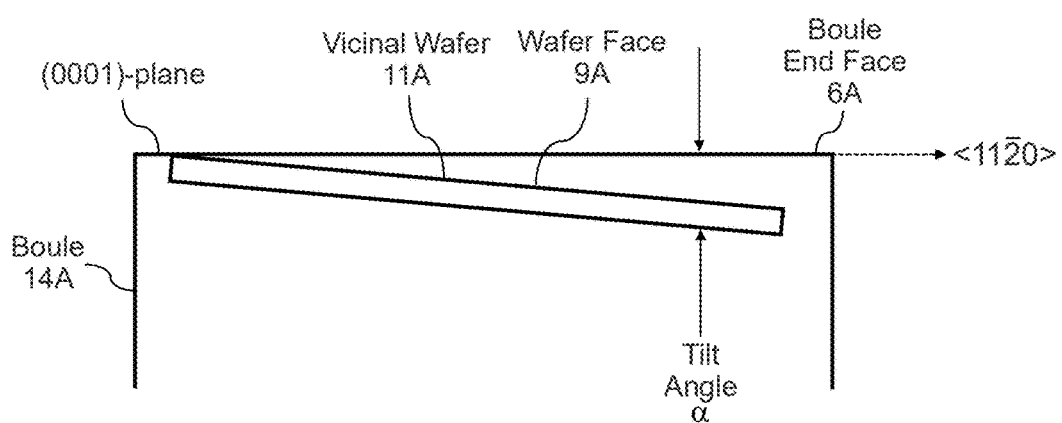
FIG. 3B is a simplified cross-sectional view of the vicinal wafer of FIG. 3A superimposed over a portion of a boule.

FIG. 3B is a simplified cross-sectional view of the vicinal wafer 11A superimposed over a portion of a boule 14A (e.g., an on-axis boule having an end face 6A parallel to the (0001) plane) from which the vicinal wafer 11A was defined. FIG. 3B shows that the wafer face 9A of the vicinal wafer 11A is misaligned relative to the (0001) plane by a tilt angle α.

Figure 3C:
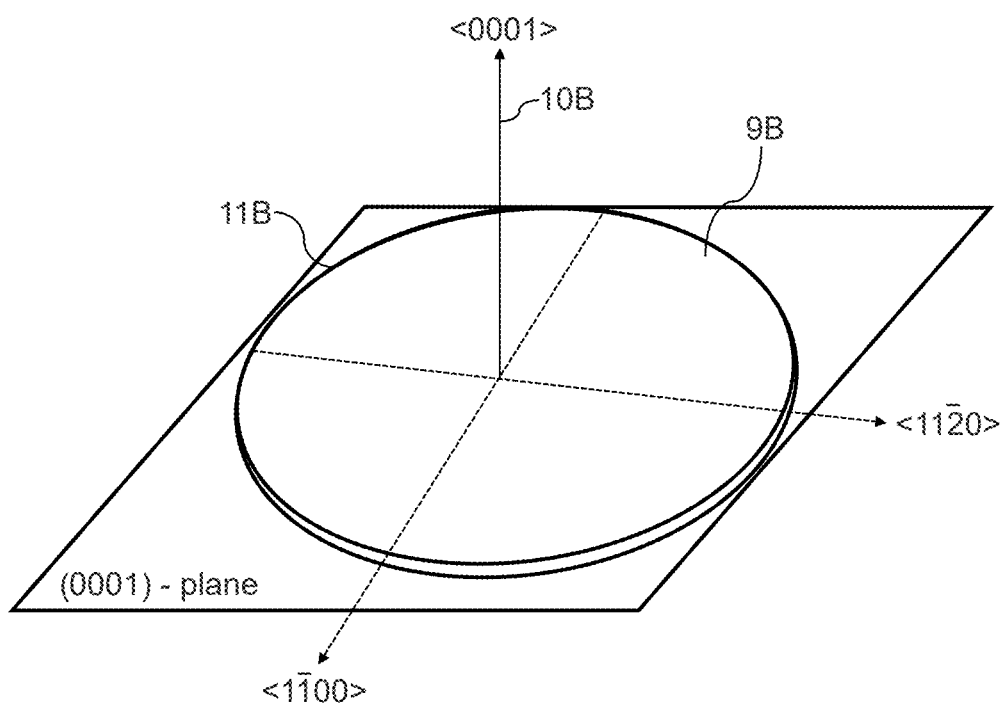
FIG. 3C is a perspective view of a wafer orientation diagram showing the orientation of an on-axis wafer relative to the c-plane.
Figure 3D:
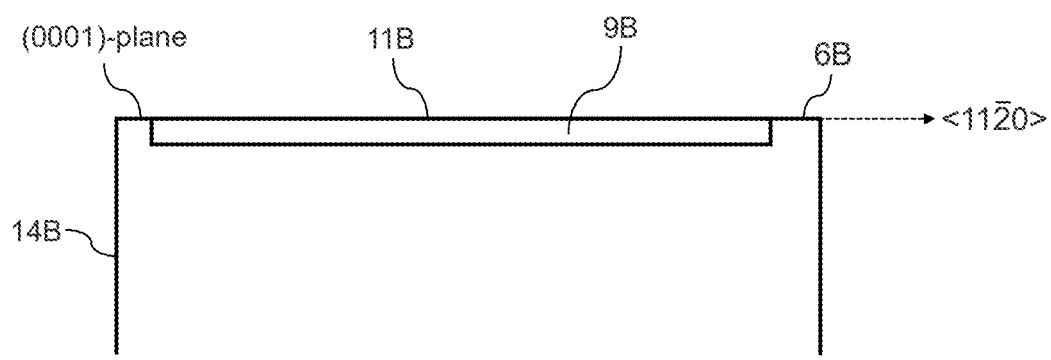
FIG. 3D is a simplified cross-sectional view of the wafer of FIG. 3C superimposed over a portion of a boule.

FIG. 3C is a perspective view of a wafer orientation diagram showing the orientation of an on-axis wafer 11B relative to the c-plane (0001), in which a vector 10B (which is normal to the wafer face 9B) is parallel to the <0001> direction. FIG. 3D is a simplified cross-sectional view of the wafer 11B superimposed over a portion of a boule 14B (e.g., an on-axis boule having an end face 6B parallel to the (0001) plane). FIG. 3D shows that the wafer face 9B of the on-axis-wafer 11B is aligned with the (0001) plane.

Figure 4:
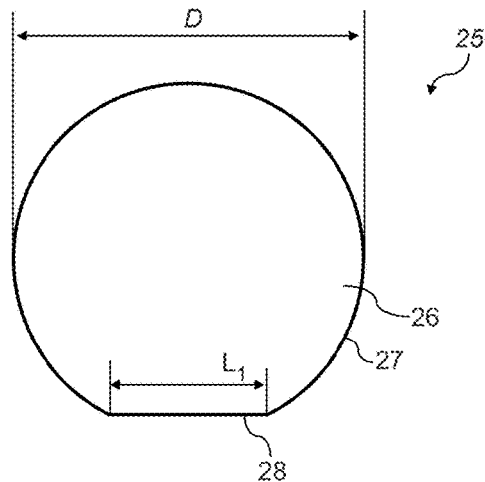
FIG. 4 is a top plan view of an exemplary SiC wafer, with superimposed arrows showing crystallographic orientation directions.

FIG. 4 is a top plan view of an example silicon carbide semiconductor wafer 25 including an upper face 26. The silicon carbide semiconductor wafer 25 may include a surface that is misaligned with (e.g., off-axis at an oblique angle relative to) the c-plane. The silicon carbide semiconductor wafer 25 may be laterally bounded by a generally round edge 27 (having a diameter D) including a primary flat 28 (having a length $L_1$) that is perpendicular, for instance, to the (11$\bar{2}$0) plane. In some instances, the wafer 25 may include a notch instead of a primary flat.

Methods disclosed herein may be applied to substrates of various crystalline materials, of both single crystal and polycrystalline varieties. In certain embodiments, methods disclosed herein may utilize cubic, hexagonal, and other crystal structures, and may be directed to crystalline materials having on-axis and off-axis crystallographic orientations. In certain embodiments, methods disclosed herein may be applied to semiconductor materials and/or wide bandgap materials. Example materials include, but are not limited to, silicon, gallium arsenide, and diamond.

In certain embodiments, such methods may utilize single crystal semiconductor materials having a hexagonal crystal structure, such as 4H—SiC, 6H—SiC, or Group III-nitride materials (e.g., GaN, AlN, InN, InGaN, AlGaN, or AlInGaN). Various illustrative embodiments described hereinafter mention SiC generally or 4H—SiC specifically, but it is to be appreciated that any suitable crystalline material may be used. Among the various SiC polytypes, the 4H—SiC polytype is particularly attractive for power electronic devices due to its high thermal conductivity, wide bandgap, and isotropic electron mobility. Bulk silicon carbide may be grown on-axis (i.e., with no intentional angular deviation from the c-plane thereof, suitable for forming undoped or semi-insulating material) or off-axis (typically departing from a grown axis such as the c-axis by a non-zero angle, typically in a range of from 0.5 to 10 degrees (or a subrange thereof such as 2 to 6 degrees or another subrange), as may be suitable for forming n-doped or highly conductive material).

Certain embodiments herein may use substrates of doped or undoped silicon carbide, such as silicon carbide boules, which may be grown by physical vapor transport (PVT) or other conventional boule fabrication methods. If doped SiC is used, such doping may render the SiC n-type or semi-insulating in character. In certain embodiments, an n-type silicon carbide boule is intentionally doped with nitrogen. In certain embodiments, an n-type silicon carbide boule includes resistivity values within a range of 0.015 to 0.028 Ohm-centimeters. In certain embodiments, a silicon carbide boule may have resistivity values that vary with vertical position, such that different substrate portions (e.g., wafers) have different resistivity values, which may be due to variation in bulk doping levels during boule growth. In certain embodiments, a silicon carbide boule may have doping levels that vary horizontally, from a higher doping region proximate to a center of the boule to a lower doping level proximate to a lateral edge thereof.

Figure 5A:
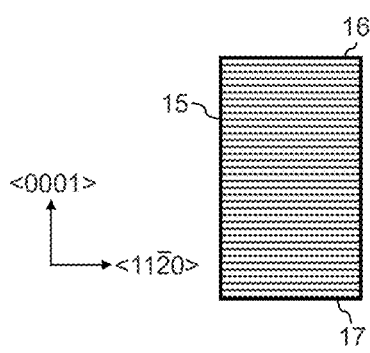
FIG. 5A is a side elevation schematic view of an on-axis boule of crystalline material.
Figure 5B:
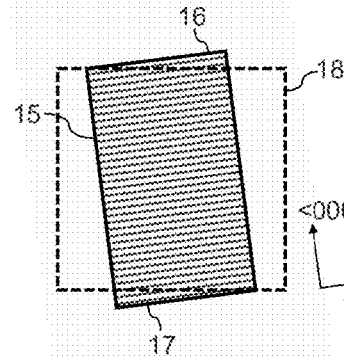
FIG. 5B is a side elevation schematic view of the boule of FIG. 5A being rotated by 4 degrees, with a superimposed pattern for cutting end portions of the boule.
Figure 5C:
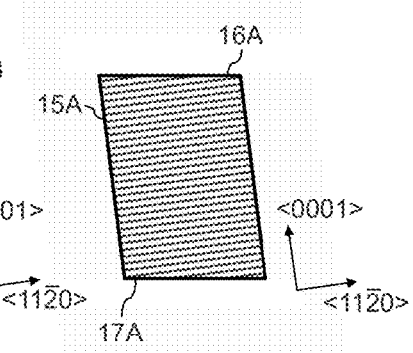
FIG. 5C is a side elevation schematic view of a boule following removal of end portions to provide end faces that are non-perpendicular to the c-direction.

FIGS. 5A and 5C schematically illustrate on-axis and off-axis crystalline substrates in the form of boules that may be utilized with methods disclosed herein. FIG. 5A is a side elevation schematic view of an on-axis boule 15 of crystalline material having first and second end faces 16, 17 that are perpendicular to the c-direction (i.e., <0001> direction for a hexagonal crystal structure material such as 4H—SiC). FIG. 5B is a side elevation schematic view of the boule 15 of FIG. 5A being rotated by four degrees, with a superimposed pattern 18 (shown in dashed lines) for cutting and removing end portions of the boule 15 proximate to the end faces 16, 17. FIG. 5C is a side elevation schematic view of an off-axis boule 15A formed from the boule 15 of FIG. 5B, following removal of end portions to provide new end faces 16A, 17A that are non-perpendicular to the c-direction. Aspects of the present disclosure are applicable to both on-axis boules 15 and/or off-axis boules 15A or other on-axis crystalline materials and/or off-axis crystalline materials.

Figure 5D:
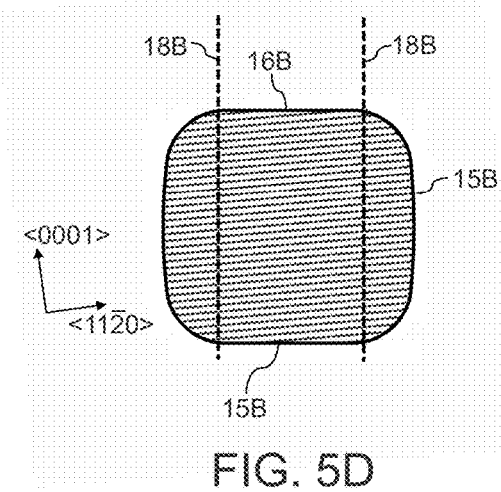
FIG. 5D is a side elevation schematic view of an off-axis grown boule of crystalline material.
Figure 5E:
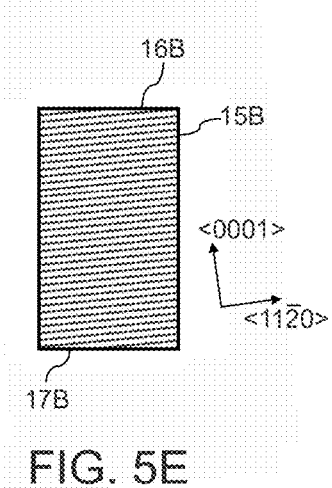
FIG. 5E is a side elevation schematic view of an off-axis grown boule having end faces that are non-perpendicular to the c-direction.

FIGS. 5D and 5E schematically illustrate off-axis grown boules that may be utilized with methods disclosed herein. FIG. 5D is a side elevation schematic view of an off-axis grown boule 15B of crystalline material (e.g., grown from an off-axis seed material) having first and second end faces 16B and 17B that are non-perpendicular to the c-direction (e.g., <0001> direction for a hexagonal crystal structure material such as 4H—SiC). Portions of the boule 15B may be cut along the superimposed pattern 18B (shown in dashed lines) to provide the off-axis boule 15B shown in FIG. 5E. Off-axis semiconductor wafers may be provided from the off-axis boule 15E by cutting or otherwise removing the wafers from the boule 15B in a manner parallel to the faces 16B, 17B.

Aspects of the present disclosure are directed to providing semiconductor wafers from any suitable boule, such as an on-axis boule, an off-axis boule, an on-axis grown boule, and off-axis grown boule, a boule grown along other directions or axes (e.g., a-axis, c-axis) or other suitable boule.

Figure 6:
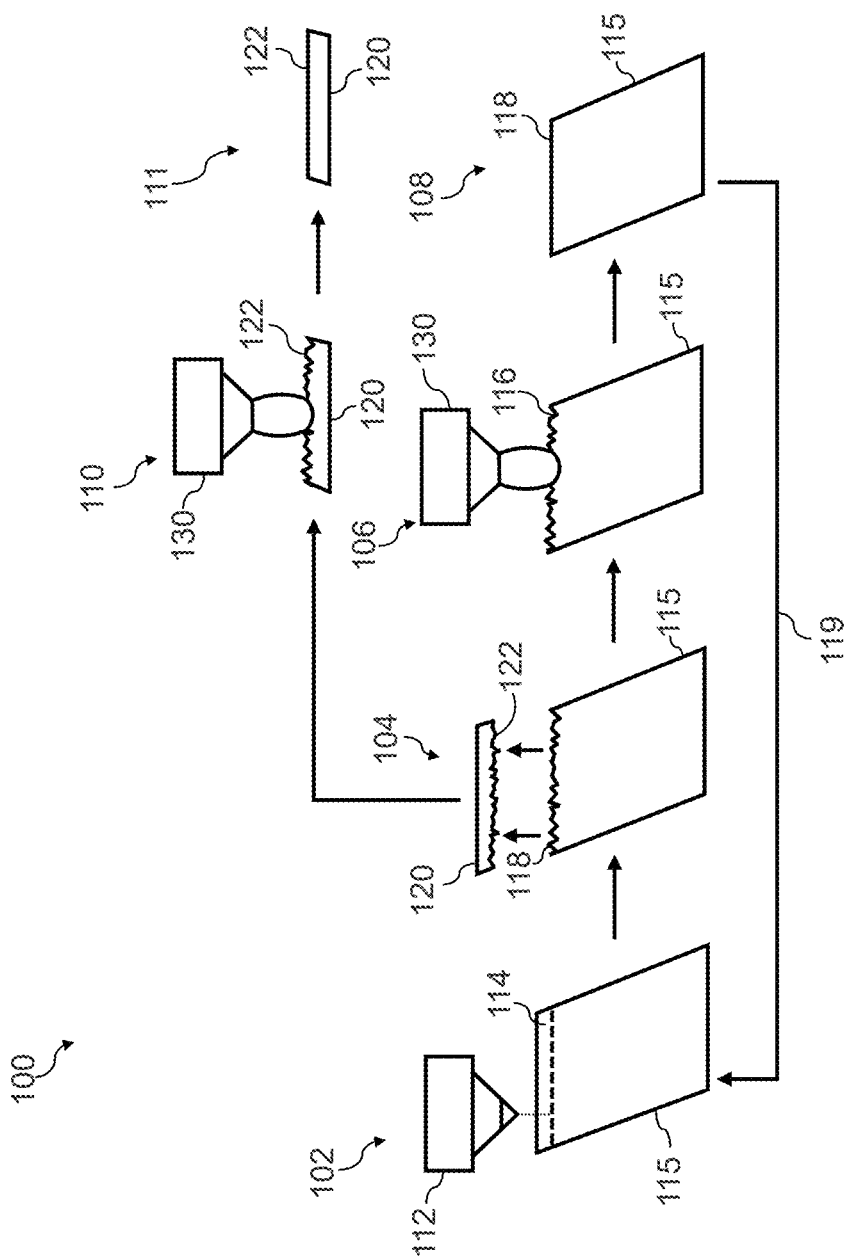
FIG. 6 depicts an overview of an example method according to examples of the present disclosure.

FIG. 6 depicts an overview of an example method 100 according to example embodiments of the present disclosure. FIG. 6 is intended to represent structures for identification and description and is not intended to represent the structures to physical scale. The method 100 depicts operations in a particular order for purposes of illustration and discussion. Those of ordinary skill in the art, using the disclosures provided herein, will understand that the various steps or operations of any of the method provided in this disclosure may be adapted, rearranged, omitted, include steps not illustrated, and/or modified in various ways without deviating from the scope of the present disclosure.

At 102, the method 100 may include performing a removal process on a boule 115 (e.g., laser-based removal process, wire saw-based removal process). For instance, one or more laser source(s) 112 may be operated according to one or more laser parameters to induce a subsurface laser damage region 114 in the boule 115. The boule 115 may be similar to the boule 15 or the off-axis boule 15A of FIGS. 5A and 5C respectively.

In some examples, the laser source 112 may be operated in accordance with certain laser parameters to induce the subsurface laser damage region 114 in the boule 115. For instance, in certain examples, a laser having a wavelength in a range of about 800 nanometers to about 1100 nanometers may be used to implement the laser-based removal process. Although a wide range of pulse frequencies may be used in certain embodiments, pulse frequencies of 120 kilohertz to 150 kilohertz may be employed in the laser-based removal process. A translation speed in a range of about 500 millimeters per second to about 3000 millimeters per second between a laser source 112 and a boule 115 may be used. However, higher or lower translation stage speeds may be used in certain embodiments with suitable adjustment of laser frequency to maintain desirable laser pulse overlap. Average laser power ranges for forming the subsurface laser damage region 114 may be in a range of from about 0.5 watts to about 10 watts for silicon carbide. Laser pulse energy may be calculated as power divided by frequency. Laser pulse widths of about 1 nanosecond to about 10 nanoseconds may be used, although other pulse widths may be used in other embodiments.

Referring to FIG. 6 at 104, the method 100 may include separating a semiconductor wafer 120 from the boule 115 along the subsurface laser damage region 114. Removing the wafer 120 from the boule 115 may be performed through a variety of methods. For instance, a mechanical fracturing process, ultrasonic fracturing process, or other fracturing process may be used to fracture and separate the semiconductor wafer 120 from the boule 115. FIG. 6 illustrates a laser-based removal process for purposes of illustration and discussion. Those of ordinary skill in the art, using the disclosures provided herein, will understand that other removal processes may be used without deviating from the scope of the present disclosure.

In some instances, separating the wafer 120 from the boule 115 may leave rough exposed surfaces on both the semiconductor wafer 120 and the boule 115. For instance, the semiconductor wafer 120 may have a surface 122 with high surface roughness, such as a surface roughness greater than about 65 microns. Similarly, the boule 115 may have a surface 118 with high surface roughness, such as a surface roughness greater than about 65 microns.

Aspects of the present disclosure are directed to using electrical discharge machining (EDM)-based surface processing operations to remove portions of the surfaces and/or to provide smoother surfaces suitable for later fabrication operations. As an example, as shown at 106, the method may include exposing the surface 118 of the boule 115 to one or more electrical discharges using an EDM system 130 to remove material from the surface 118. The EDM-based processing may result in a smoother surface 118 of the boule 115 as shown at 108.

By processing the surface 118 of the boule 115 with the EDM system 130 as shown at 106, the boule 115 may be suitable to be reused for subsequent removal processes as indicated by arrow 119 (e.g., subsequent laser-based removal processes). More particularly, the surface 118 of the boule 115 may be smoothed to allow for the formation of subsequent laser damage regions 114 in the boule 115. Otherwise, a rough surface on the boule 115 may lead to undesirable reflection/refraction of one or more laser(s) used during the formation of the subsurface laser damage regions for removal of subsequent semiconductor wafers. In some examples, additional surface processing operations may occur on the boule 115 before subsequent removal processes (e.g., grinding, polishing, lapping, etc.).

As another example, as shown at 110, the method may include exposing the surface 122 of the semiconductor wafer 120 to one or more electrical discharges using the EDM system 130 to remove material from the surface 122. The EDM-based processing may result in a smoother surface 122 of the semiconductor wafer 120 as shown at 111. Accordingly, the semiconductor wafer 120 may be suitable for subsequent semiconductor device fabrication operations.

Figure 7:
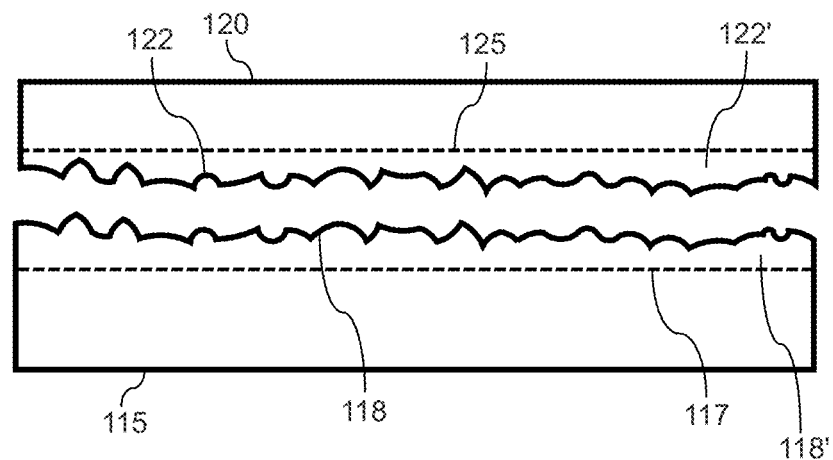
FIG. 7 depicts a cross-sectional representation of a boule that has been subjected to a laser-based removal process according to examples of the present disclosure.

FIG. 7 depicts a cross-sectional representation of the boule 115 after undergoing a removal process according to example aspects of the present disclosure. As shown, the semiconductor wafer 120 has been separated from the boule 115 leaving a rough surface 118 on the boule 115 and a rough surface 122 on the semiconductor wafer 120. The boule 115 may include a removal portion 118' that may be removed using EDM-based processing (e.g., exposure of the removal portion 118' to one or more electrical discharges) up to removal point 117 to provide a smoother surface on the portion of the boule 115. Similarly, the semiconductor wafer 120 may include a removal portion 122' that may be removed using EDM-based processing (e.g., exposure of the removal portion 118' to one or more electrical discharges) up to removal point 125 to provide a smoother surface on the portion of the semiconductor wafer 120.

Figure 8:
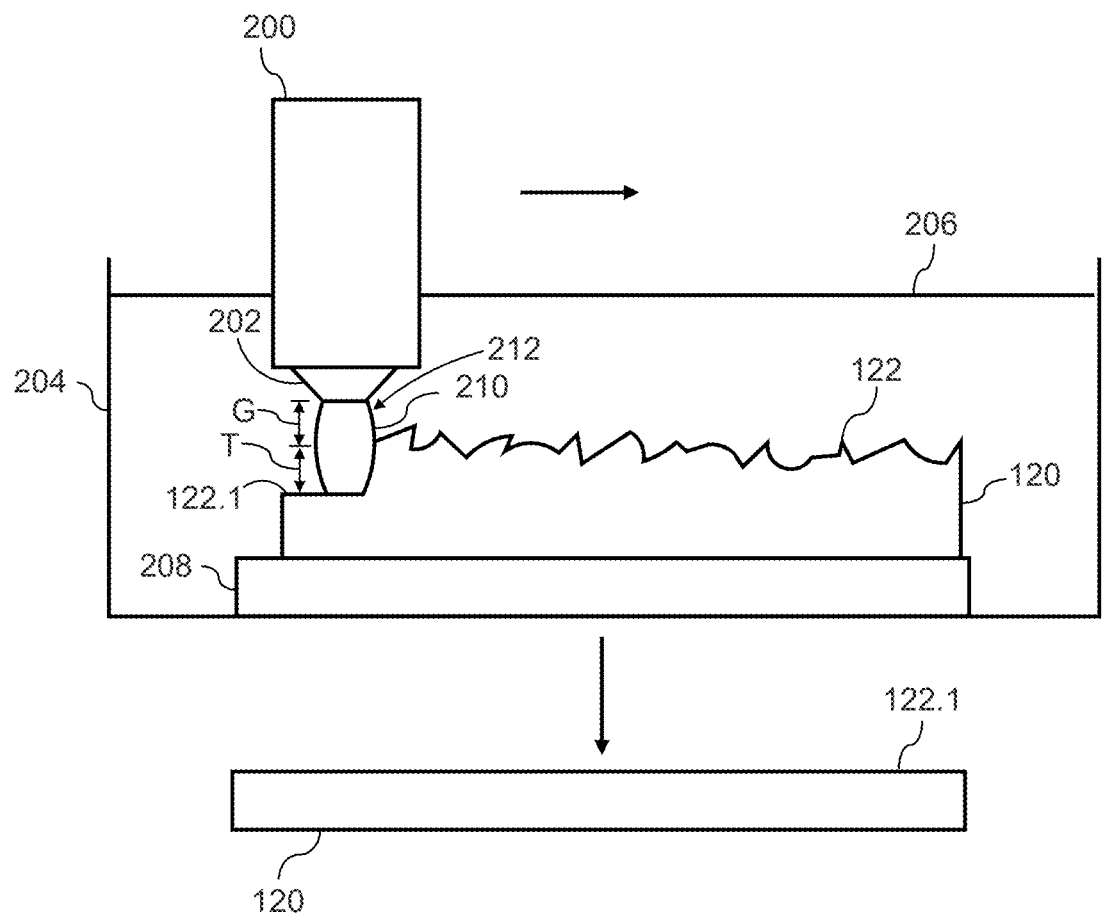
FIG. 8 depicts example exposure of a semiconductor workpiece to one or more electrical discharges according to examples of the present disclosure.

FIG. 8 depicts example EDM-based processing of the surface 122 of the semiconductor wafer 120 according to examples of the present disclosure. FIG. 8 is illustrated with respect to exposing the surface 122 of the semiconductor wafer 120 to one or more electrical discharges for purposes of illustration and discussion. Those of ordinary skill in the art, using the disclosures provided herein, will understand that such EDM-based processing may be implemented on the surface 118 of the boule 115 (or any other surface of the boule 115, such a surface from which a seed end or a dome end was removed) without deviating from the scope of the present disclosure.

As shown in FIG. 8, the EDM-based processing may be implemented on the surface 122 using an EDM system 200. The EDM system 200 is configured to generate one or more electrical discharges between an electrode head 202 of the EDM system 200 and the surface 122. As used herein, generating one or more electrical discharges refers to both generating a continuous electrical discharge and/or generating modulated electrical discharges (e.g., a plurality of electrical discharges). In this respect, the EDM system includes a tank 204 in which the semiconductor wafer 120 is submerged in a dielectric fluid 206. The dielectric fluid is an insulator medium that does not conduct electricity. Thus, the dielectric flushes away eroded material and cools the workpiece and electrode head. The dielectric fluid can be a low viscosity dielectric fluid when the semiconductor wafer 120 has a finer finish as such a low viscosity fluid allows refuse to be removed more easily. Alternatively, the dielectric fluid can be a high-viscosity fluid when the semiconductor wafer 120 has a rougher finish and/or larger material removal amounts/rates are needed. The dielectric fluid also may be selected based on the voltage gap between the electrode head and the semiconductor wafer 120. In some examples, the dielectric fluid may be oil, kerosene, other hydrocarbon fluids, transformer oil, paraffin, white spirit, or deionized water. In some examples, the dielectric fluid may have a conductivity in a range of about 0.1 µS/cm to about 1 µS/cm. For example, in one embodiment, the semiconductor wafer 120 may be positioned on (e.g., secured to) a workpiece support 208 located at the bottom of the tank 204 such that the surface 122 can be submerged or covered in the dielectric fluid 206. The electrode head 202 is positioned relative to the surface 122 such that a gap G is defined between the electrode head 202 and the surface 122. A potential difference between the electrode head 202 and the semiconductor wafer 120 is applied. This results in the generation of an electrical discharge 210 across the gap G to create a plasma zone 212 within the gap G such that semiconductor material is removed from the surface 122.

In some examples, the EDM system 200 may be operated in accordance with the following EDM system parameters to implement the EDM-based surface processing:

Duration of the electrical pulse supplied to the electrode head: about 6 microseconds to about 100 microseconds, such as about 6 microseconds to about 50 microseconds;

Peak current of the electrical pulse supplied to the electrode head: about 6 Amps to about 17 Amps, such as about 6 Amps to about 10 Amps;

Discharge voltage: about 50 V to about 350 V, such as about 50 V to about 300 V, such as about 100 V to about 250 V.

Pulse frequency: about 10 KHz to about 200 KHz; such as about 10 KHz to about 100 KHz Duty factor: about 50% to about 85%, such as about 50% to about 75%;

Electrode or spark gap: about 5 microns to about 2000 microns, such as about 5 microns to about 1000 microns, such as about 100 microns to about 500 microns;

Translation speed: about 1 millimeter per second to about 500 millimeters per second, such as about 1 millimeter per second to about 250 millimeters per second.

Other parameters that may be used to operate the EDM system 200 include the polarity (i.e., positive or negative), workpiece material, electrode material, electrode shape, and/or dielectric fluid type.

Discharge voltage is the voltage produced between the workpiece and the electrode head when DC power is supplied to the electrode head.

Duration of the electrical pulse supplied to the electrode head is the duration of time for which current is allowed to flow per cycle.

Polarity may be positive or negative. In some examples, the material removal rate may be higher when the electrode head is connected to a positive polarity.

Pulse frequency is the number of cycles produced in the gap between the electrode head and the workpiece in one second.

Duty factor is the ratio between the duration of the electrical pulse supplied to the electrode head and the total cycle time converted into a percentage.

Electrode gap is the distance between the electrode head and the workpiece during the EDM-based processing.

In some examples, rotation of the electrode head can be used to increase the material removal rate in EDM-based processing.

The dielectric fluid may circulate freely between the electrode head and the workpiece. Eroded material should be flushed out at the earliest opportunity. For instance, flushing methods include pressure flushing, suction flushing, and side flushing.

The EDM-based processing may remove material from the surface 122 and produce a surface 122.1 with a surface roughness between about 20 nanometers and about 65 microns, such as between about 20 nanometers and 10 microns, such as between about 25 nanometers and 1 micron, such as between about 25 nanometers and about 150 nanometers. In addition, in some examples, the EDM-based processing may reduce a thickness T of the semiconductor wafer 120 by about 5 microns to about 500 microns, such as by about 5 microns to about 100 microns, such as by about 25 microns to about 80 microns, such as by about 40 microns to about 60 microns.

In some examples, the EDM-based processing may be performed in multiple passes of the electrode head 202 across the surface 122 to achieve the desired material removal or thickness reduction in the surface 122. For instance, multiple passes of the electrode head 202 across the surface 122 such that a gap of about 0.01 to about 1 millimeter is maintained between the electrode head 202 and the surface 122 may be performed to achieve a desired reduction in thickness T of, for example, about 25 microns or more.

Figure 9:
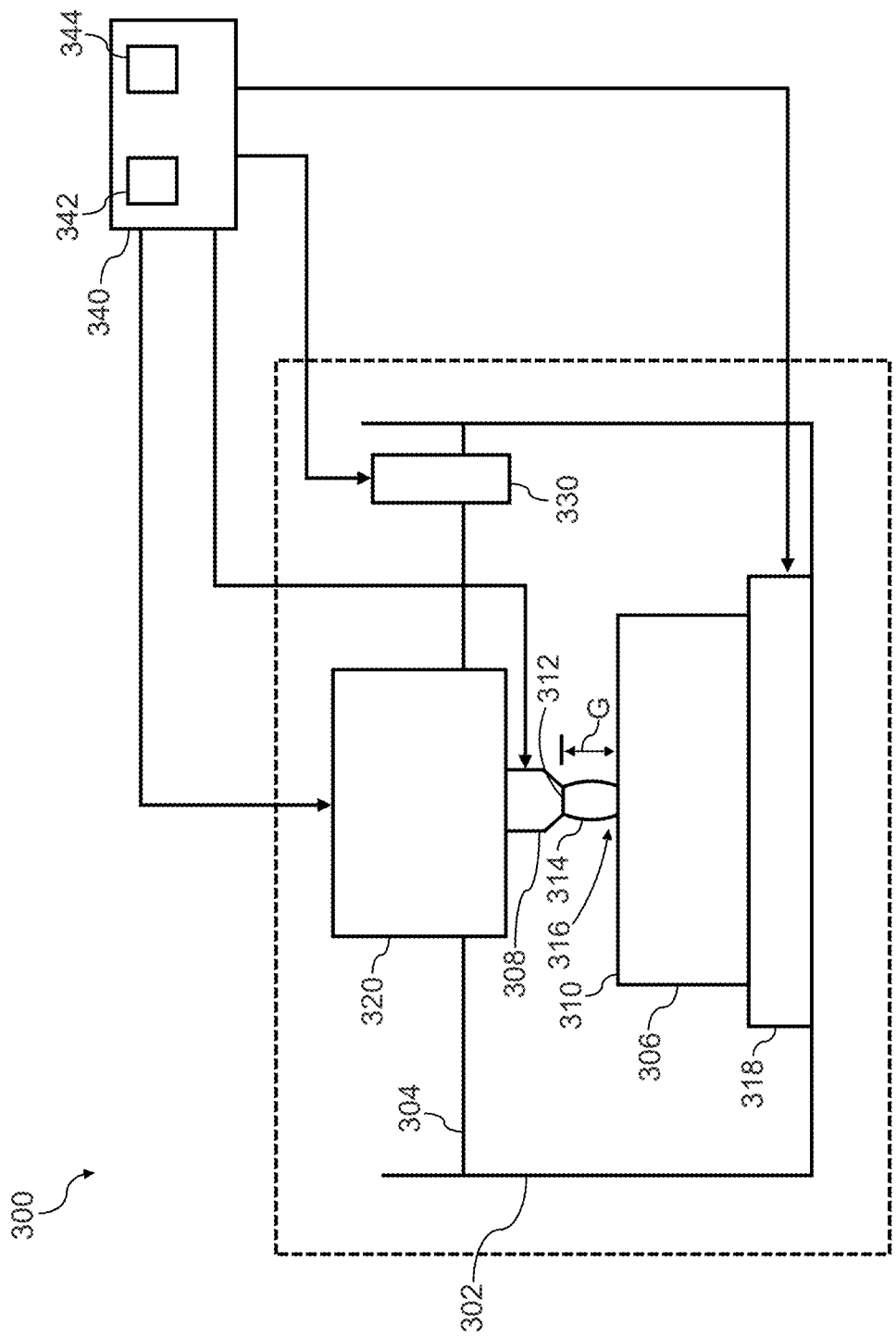
FIG. 9 depicts an example electrical discharge machining (EDM) system according to examples of the present disclosure.

FIG. 9 depicts an example EDM system 300 according to examples of the present disclosure. The EDM system 300 may be configured to implement one or more aspects of the present disclosure, such as the EDM-based removal processes and/or EDM-based surface processing operations disclosed herein.

The EDM system 300 includes a tank 302. In general, the tank 302 is operable to contain a dielectric fluid 304 and a semiconductor workpiece 306 submerged within the dielectric fluid 304. Thus, the tank 302 may have any suitable structure for containing a fluid, such as a plurality of walls defining a chamber suitable for receiving and holding a fluid (e.g., a liquid). In some embodiments, the dielectric fluid 304 may be oil, kerosene, paraffin, white spirit, deionized water, or similar fluid. In some examples, the dielectric fluid may have a conductivity in a range of about 0.1 µS/cm to about 1 µS/cm. Moreover, in some examples, the workpiece 306 may be a semiconductor wafer or a semiconductor boule (e.g. the semiconductor wafer 120 and/or the boule 115).

Figure 20:
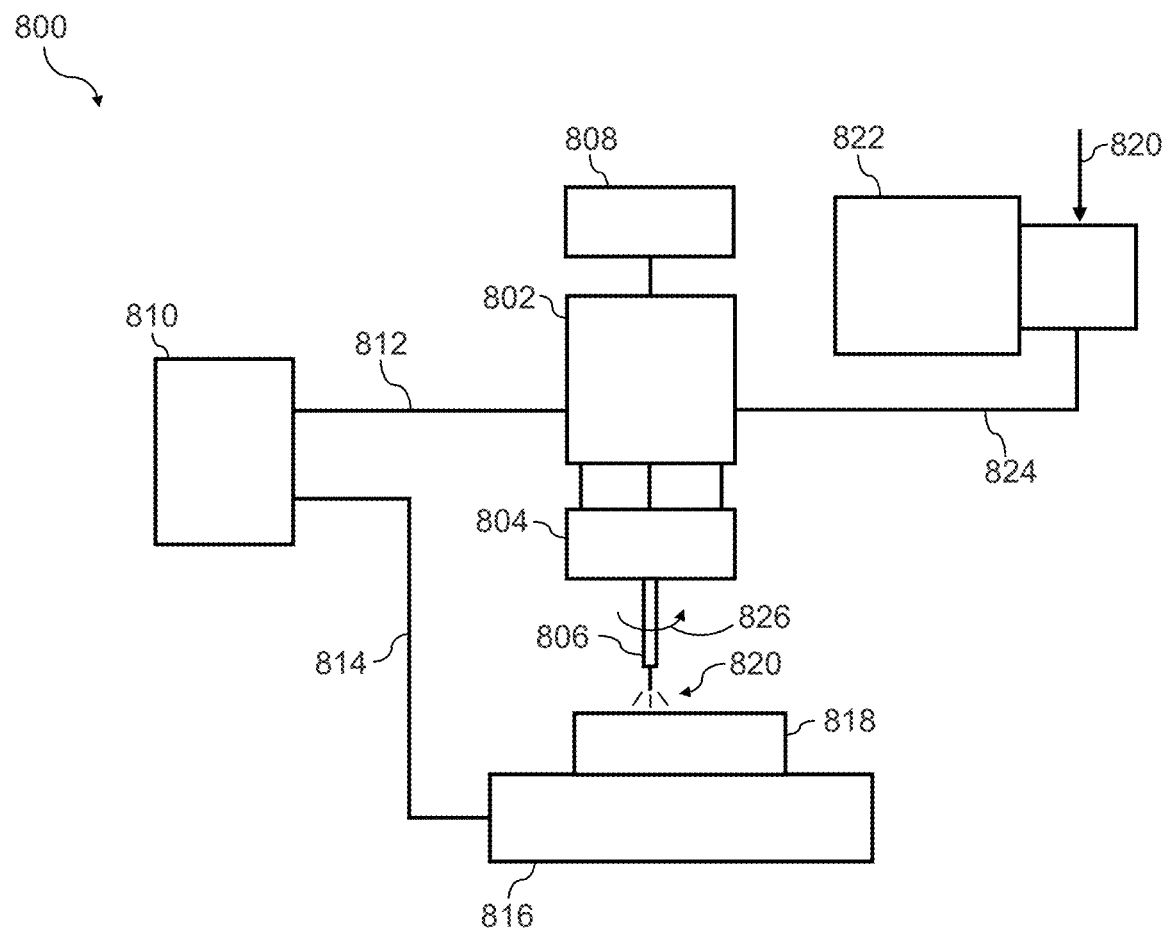
FIG. 20 depicts an example electrical discharge machining (EDM) machine according to examples of the present disclosure.

Furthermore, the EDM system 200 includes an electrode head 308. In general, the electrode head 308 may be operable to be positioned relative to a surface 310 of the semiconductor workpiece 306 to be processed such that a gap G is defined between an end 312 of the electrode head 308 and the surface 310. As such, when a bias voltage is supplied to the electrode head 308, an electrical discharge 314 is generated across the gap G and a plasma zone 316 is created within the gap G that removes material from the surface 303. That is, the generation of the electrical discharge erodes the material present on the surface 310 of the semiconductor workpiece 306. In some embodiments, the EDM system 200 can include multiple electrode heads. FIG. 20 depicts an EDM machine 800 including an electrode head that can be incorporated into the EDM system 300.

In one example, the electrode head 308 may have any suitable length and any suitable width. For instance, in one example, the head 308 can have a length in a range of about 1 millimeter to about 200 millimeters, such as in the range of about 5 millimeters to about 10 millimeters. Moreover, in such an example, the head 308 can have a width in a range of about 1 millimeter to about 200 millimeters, such as in the range of about 5 millimeters to about 10 millimeters.

The electrode head 308 may have any suitable cross-sectional shape. For example, the cross-sectional shape of the electrode head 308 can be a rectangle, square, circle, hexagonal, etc.

The electrode head 308 may be constructed from any suitable material. The electrode head 308 can be metallic, non-metallic, or a combination of metallic and non-metallic. For example, the electrode head 308 can be constructed from copper, brass, graphite, copper tungsten, silver tungsten, copper graphite, and tungsten carbide.

The system 300 includes a workpiece support 318 configured to support a semiconductor workpiece 306 (e.g. the boule 115 and/or the semiconductor wafer 120). The workpiece support 318 may include a chuck (e.g., vacuum chuck) or other mechanism to hold the workpiece 306 in place during EDM-based processing according to examples of the present disclosure.

The electrode head 308 may be coupled to a translation stage 320 that may move the electrode head 308 relative to the workpiece 306. Furthermore, the electrode head 308 may include one or more actuators (e.g., electric motors, electric linear actuators, etc.) to facilitate moving the electrode head 308 relative to the workpiece 306. In addition, or in the alternative, the workpiece support 318 may be operable to move the workpiece 306 relative to the electrode head 308. In this way, the system 300 may be able to control the translation stage 320 and/or the workpiece support 318 to impart relative motion (e.g., linear translation and/or rotational motion) between the electrode head 308 and the workpiece 306 to implement EDM-based removal processes according to examples of the present disclosure. In some examples, the translation stage 320 and/or the workpiece support 318 may be controlled to impart relative motion between the electrode head 308 and the workpiece 306 to scan at least 85% of the surface through relative motion between the one or more electrode head 308 and the surface, such as at least 95% of the surface, such as at least 99% of the surface to implement EDM-based processing according to examples of the present disclosure. However, in some examples, the electrode head 308 may scan less of the surface, such as less than about 50% of the surface.

In some examples, the EDM system 300 may be controlled to remove material from the semiconductor workpiece 306 in accordance with various EDM system parameters. The EDM system parameters may include, for instance, the duration of the electrical pulse supplied to the electrode head 308, the current of the electrical pulse supplied to the electrode head 308, the translation speed, etc. In one example, the EDM system 300 may be controlled in accordance with the following EDM system parameters:

Duration of the electrical pulse supplied to the electrode head: about 6 microseconds to about 100 microseconds, such as about 6 microseconds to about 50 microseconds;

Peak current of the electrical pulse supplied to the electrode head: about 6 Amps to about 17 Amps, such as about 6 Amps to about 10 Amps;

Discharge voltage: about 50 V to about 350 V, such as about 50 V to about 300 V, such as about 100 V to about 250 V.

Pulse frequency: about 10 KHz to about 200 KHz; such as about 10 KHz to about 100 KHz Duty factor: about 50% to about 85%, such as about 50% to about 75%;

Electrode or spark gap: about 5 microns to about 2000 microns, such as about 5 microns to about 1000 microns, such as about 100 microns to about 500 microns;

Translation speed: about 1 millimeter per second to about 500 millimeters per second, such as about 1 millimeter per second to about 250 millimeters per second.

Other parameters that may be used to operate the EDM system 300 include the polarity (i.e., positive or negative), workpiece material, electrode material, electrode shape, and/or dielectric fluid type. In some embodiments, the EDM system 300 may additionally include one or more sensors 330 for obtaining data associated with the workpiece 306, such as workpiece property data for the workpiece 306. The workpiece property data may include, for instance, data associated with a surface of the workpiece 306 (e.g., topography, roughness), subsurface regions of the workpiece 306, optical properties of the workpiece 306, temperature of the workpiece 306, doping level of the workpiece 306, polytype of the workpiece 306 (e.g., 4H, 6H), or other parameters.

In some embodiments, the one or more sensors 330 may include, for instance, an optical sensor, such as an image capture device (e.g., camera) that may capture images at one or more wavelengths of visible light and/or ultraviolet or infrared light. In some embodiments, the one or more sensors 330 may include one or more surface measurement lasers that may be operable to emit a laser onto the surface of the workpiece 306 and scan the surface (based on reflections of the laser) for depth measurements, topography measurements, etc. of the surface of the workpiece 306. Other suitable sensors 330 may be used without deviating from the scope of the present disclosure.

The EDM system 300 includes one or more control devices, such as a controller 340. The controller 340 may include one or more processors 342 and one or more memory devices 344. The one or more memory devices 344 may store computer-readable instructions that when executed by the one or more processors 342 cause the one or more processors 342 to perform one or more control functions, such as any of the functions described herein. The controller 340 may be in communication with various other aspects of the EDM system 300 through one or more wired and/or wireless control links. The controller 340 may send control signals to the various components of the EDM processing system 300 (e.g., the electrode head 308, the workpiece support 318, the sensor 330) to implement an EDM-based processing operation on the workpiece 306.

In some embodiments, the controller 340 may control aspects of the EDM system 300 (e.g., the electrode head 308) based at least in part on data from the sensor(s) 330. For instance, the controller 340 may adjust various EDM system parameters for generating electrical discharges 314 with the electrode head 308 based at least in part on data from the sensor(s) 330. The EDM system parameters may include, for instance, one or more of the duration of the electrical pulses supplied to the electrode head 308, the current of the electrical pulse supplied to the electrode head 308, the scan pattern, and/or the translation speed. The controller 340 may be configured to adjust the EDM system parameters based on sensor data associated with a current workpiece 306 undergoing an EDM-based surface processing operation (e.g., dynamic adjustment during or after an EDM-based surface processing operation) or based on sensor data associated with past semiconductor workpieces that had previously undergone an EDM-based surface processing operation. In some embodiments, the electrode head 308 may include one or more actuators (e.g., to move the electrode head 308 relative to the workpiece 306), one or more power control devices (e.g., one or more switches, transformers, etc. to adjust the duration or current of the electric pulse being supplied to the electrode head 308), etc.

Figure 10:
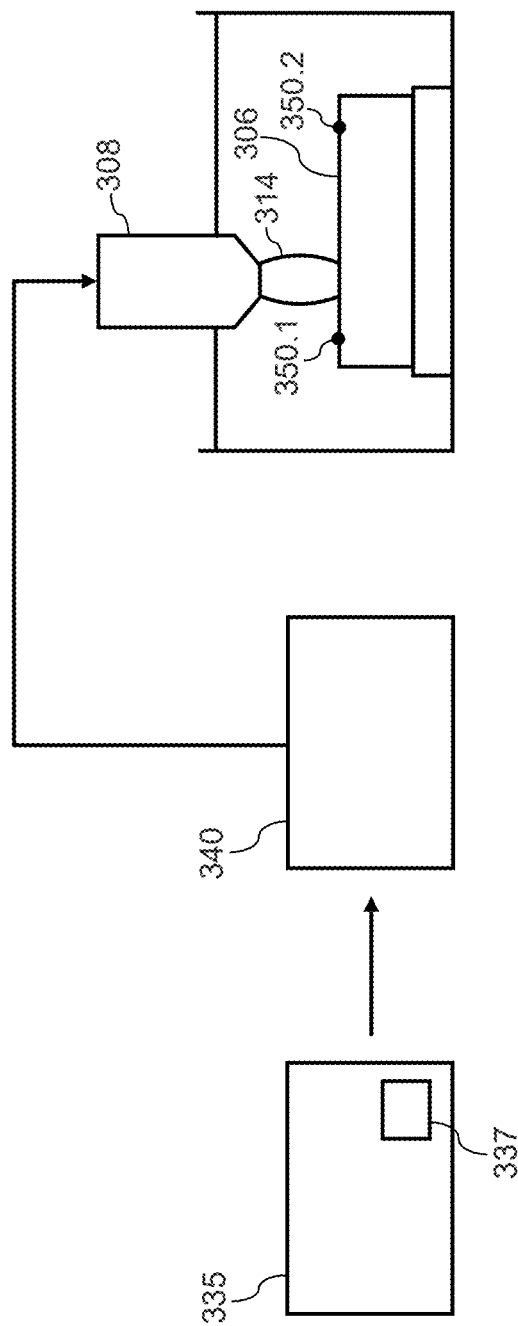
FIG. 10 depicts example control of an EDM system based on sensor data according to examples of the present disclosure.

FIG. 10 depicts an overview of example control of an EDM system 300 and, in particular, an electrode head 308 of the EDM system 300 based at least in part on sensor data 335 from the one or more sensors 330 or other data (e.g., from metrology tools) according to examples of the present disclosure. As shown, the sensor data 335 may be provided to the controller 340 (e.g., through a communication link). The sensor data 335 may include, for instance, workpiece property data 337. Workpiece property data 337 may include data associated with a surface of the workpiece 306 (e.g., topography, roughness), subsurface regions of the workpiece 306, optical properties of the workpiece 306, temperature of the workpiece 306, doping level of the workpiece 306, polytype of the workpiece 306 (e.g., 4H, 6H), or other parameters. In some examples, the workpiece property data 337 may include data associated with a surface topography of the workpiece. In some examples, the workpiece property data 337 may include an image of the exposed surface obtained using an optical sensor or image capture device. In some examples, a scan of the exposed surface may be obtained using one or more surface measurement lasers or other optical devices. In some examples, an image may be captured of the exposed surface and analyzed using computer image processing techniques (e.g., classifier models, such as machine-learned classifier models) to determine data indicative of workpiece properties, such as the presence of anomalies, defects, roughness, topography, optical properties, etc. The controller 340 may determine one or more laser parameters for the one or electrical discharges 314 generated between the electrode head 308 and the workpiece 306 based on the sensor data 335 or other data. For instance, in some embodiments, the controller 340 may access a model, algorithm, function, lookup table, machine-learned model, etc., that correlates one or more EDM system parameters based on the data and/or position on the workpiece 306.

In some embodiments, the one or more EDM system parameters are specified as a function of both a position on the workpiece 306 and sensor data 335 or other data associated with that specific position. For instance, the controller 340 may determine a first set of EDM system parameters for the electrode head 308 for removing material at a first position 350.1 on the workpiece 306. The controller 340 may determine a second set of EDM system parameters for the electrode head 308 for removing material at a second position 350.2 on the workpiece 306. The first set of EDM system parameters may be different from or the same as the second set of EDM system parameters.

In this way, the EDM system parameters may be continuously or periodically adjusted or tuned to perform material removal based on one or more workpiece properties at a specific position on the workpiece 306. In some embodiments, this may provide, for instance, a higher current for the electrical pulse supplied to the electrode head 308 when the electrode head 308 is at a first position 350.1 on the workpiece 306 relative to a second position 350.2 on the workpiece 306. In some embodiments, this may provide, for instance, a longer duration for the electrical pulse supplied to the electrode head 308 when the electrode head 308 is at a first position 350.1 on the workpiece 306 relative to a second position 350.2 on the workpiece 306. A variety of EDM system parameters (e.g., duration of the electrical pulse supplied to the electrode head, the current of the electrical pulse supplied to the electrode head, etc.) may be adjusted as a function of position on the workpiece and/or sensor data or other data without deviating from the scope of the present disclosure.

In some examples, the electrode head 308 or the EDM system 300 may be dynamically adjusted, or tuned, during an EDM-based surface processing operation. For instance, the one or more sensors 330 or other data sources may provide sensor data 335 or other data to the controller 340 and the controller 340 may determine, or adjust, one or more EDM system parameters for the electrode head 308 based on the data while performing the EDM-based surface processing operation. For instance, the one or more sensors 330 may provide data indicative of a surface topography of the workpiece 306 to the controller 340 while the electrode head 308 is processing the surface of the workpiece 306. The controller 340 may then adjust one or more EDM system parameters of the electrode head 308 based on the data while the electrode head 308 is still processing the surface of the workpiece 306. In this way, the one or more laser parameters may be dynamically adjusted, or tuned, during laser surface processing operations.

In some examples, the one or more EDM system parameters of the electrode head 308 of the EDM system 300 may be adaptively tuned, or adjusted, through multiple EDM-based surface processing operations. For instance, data regarding the workpiece 306 (e.g., workpiece property data) may be collected before, during, and/or after an EDM-based surface processing operation. The controller 340 may then tune or adjust one or more EDM parameters of the electrode head 308 based on the data. For instance, the electrode head 308 may include a set of one or more EDM system parameters for an EDM-based surface processing operation. The electrode head 308 may perform an EDM-based surface processing operation on the surface of a workpiece 306 and the one or more sensors 330 may obtain workpiece property data after the operation. The workpiece property data may then be provided to the controller 340 which may adjust, or tune, one or more of the set EDM system parameters associated with the electrode head 308 and reprocess the surface of the workpiece 306.

In some examples, the one or more EDM system parameters may be adaptively tuned for future EDM-based surface processing operations and/or future additional workpiece(s) 306. For instance, the controller 340 may determine one or more EDM system parameter adjustments based on one or more EDM-based surface processing operations on a first workpiece 306 and apply the adjustments to one or more EDM system parameters for an EDM-based surface processing operation on a second workpiece 306.

Figure 11:
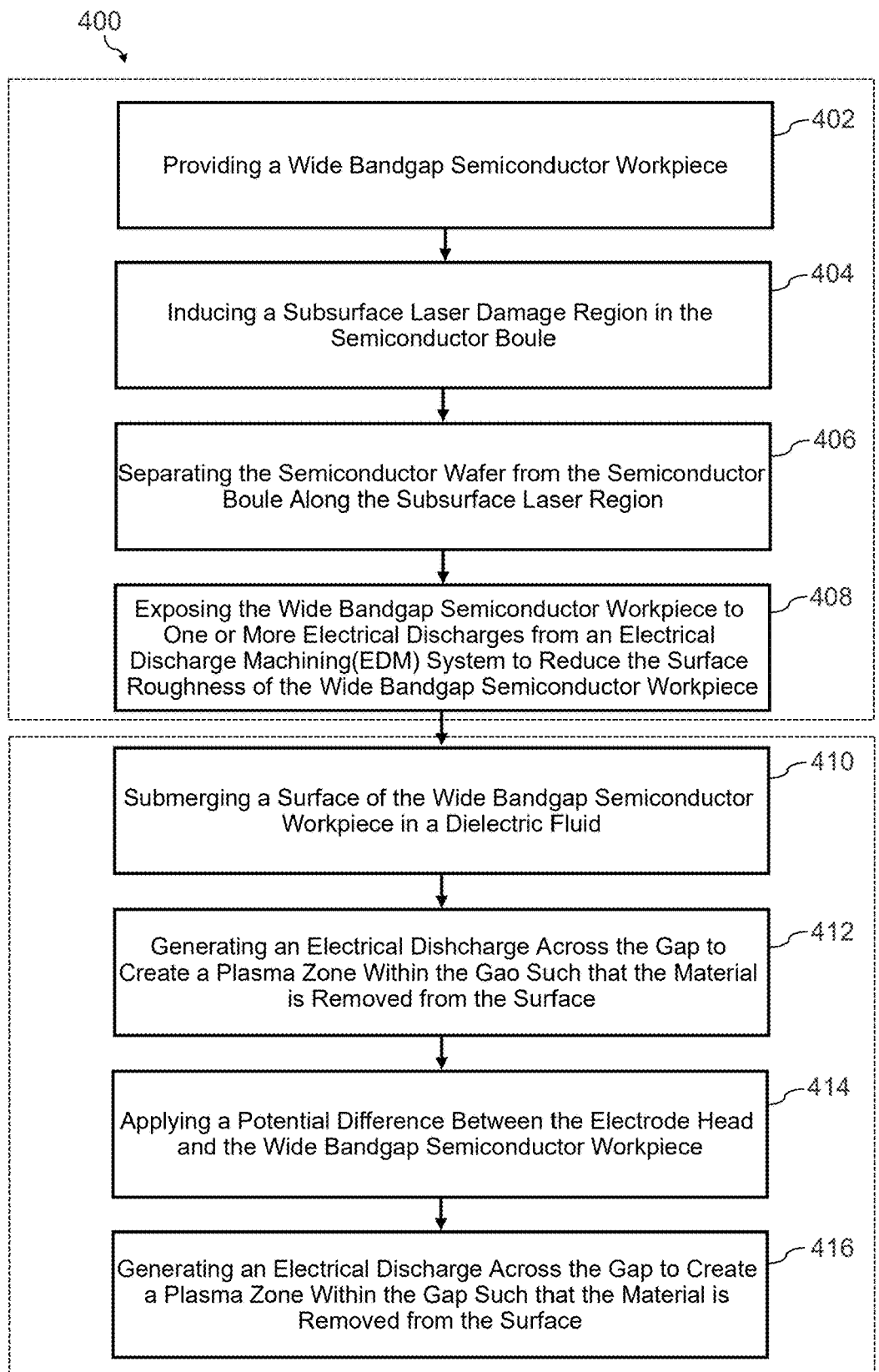
FIG. 11 depicts a flow chart diagram of an example method according to examples of the present disclosure.

FIG. 11 depicts a flow chart diagram of an example method 400 according to example aspects of the present disclosure. The method 400 includes operations illustrated in a particular order for purposes of illustration and discussion. Those of ordinary skill in the art, using the disclosures provided herein, will understand that the various steps or operations of any of the method provided in this disclosure may be adapted, rearranged, omitted, include steps not illustrated, and/or modified in various ways without deviating from the scope of the present disclosure.

At 402, the method 400 includes providing a wide bandgap semiconductor workpiece. In some examples, the wide bandgap semiconductor workpiece is a silicon carbide or Group-III nitride workpiece. In some examples, the semiconductor workpiece may be a semiconductor boule or a semiconductor wafer. For example, the semiconductor wafer may be removed from the semiconductor boule using a removal process.

As shown in FIG. 11, the removal process may include, for example, at 404, inducing a subsurface laser damage region in the semiconductor boule. In some instances, the subsurface laser damage may be induced in the semiconductor boule using one or more lasers. The removal process may additionally include, for example, at 406 separating the semiconductor wafer from the semiconductor boule along the subsurface laser damage region. A variety of separation methods may be used to separate the wide bandgap semiconductor wafer from the semiconductor boule.

At 408, the method 400 includes exposing the wide bandgap semiconductor workpiece to one or more electrical discharges from an electrical discharge machining (EDM) system to reduce the surface roughness of the wide bandgap semiconductor workpiece. In embodiments in which the workpiece is a semiconductor wafer, the surface exposed to the one or more electrical discharges may be the surface of the wafer from which the boule was separated. Alternatively, in embodiments in which the workpiece is a semiconductor boule, the surface exposed to the one or more electrical discharges may be the surface from which the wafer was separated or a surface from which the seed end or a dome end of the boule was removed.

In some embodiments, the EDM-based removal process may remove material from the surface of the wide bandgap semiconductor workpiece such that the surface has a surface roughness in a range of about 20 nanometers to about 65 microns.

At 410, exposing the wide bandgap semiconductor workpiece to one or more electrical discharges may include submerging the surface of the wide bandgap semiconductor workpiece in a dielectric fluid. For instance, the semiconductor workpiece may be submerged in a tank containing a dielectric fluid. In some examples, the dielectric fluid may be oil, kerosene, paraffin, white spirit, deionized water, or similar fluid. In some examples, the dielectric fluid may have a conductivity in a range of about 0.1 µS/cm to about 1 µS/cm.

At 412, exposing the wide bandgap semiconductor workpiece to one or more electrical discharges may include positioning an electrode head relative to the surface such that a gap is defined between an end of the electrode head and the surface. For instance, an electrode head of an EDM system may be positioned relative to a surface of the workpiece to be processed such that a gap is defined between the end of the electrode head and the surface of the workpiece.

At 414, exposing the wide bandgap semiconductor workpiece to one or more electrical discharges may include applying a potential difference between the electrode head and the wide bandgap semiconductor workpiece. This may include, for example, supplying a bias voltage to the electrode head.

At 416, exposing the wide bandgap semiconductor workpiece to one or more electrical discharges may include generating an electrical discharge across the gap to create a plasma zone within the gap such that the material is removed from the surface. For instance, when the bias voltage is supplied to the electrode head, an electrical discharge is generated across the gap and a plasma zone is created within the gap that removes material from the surface.

Figure 12:
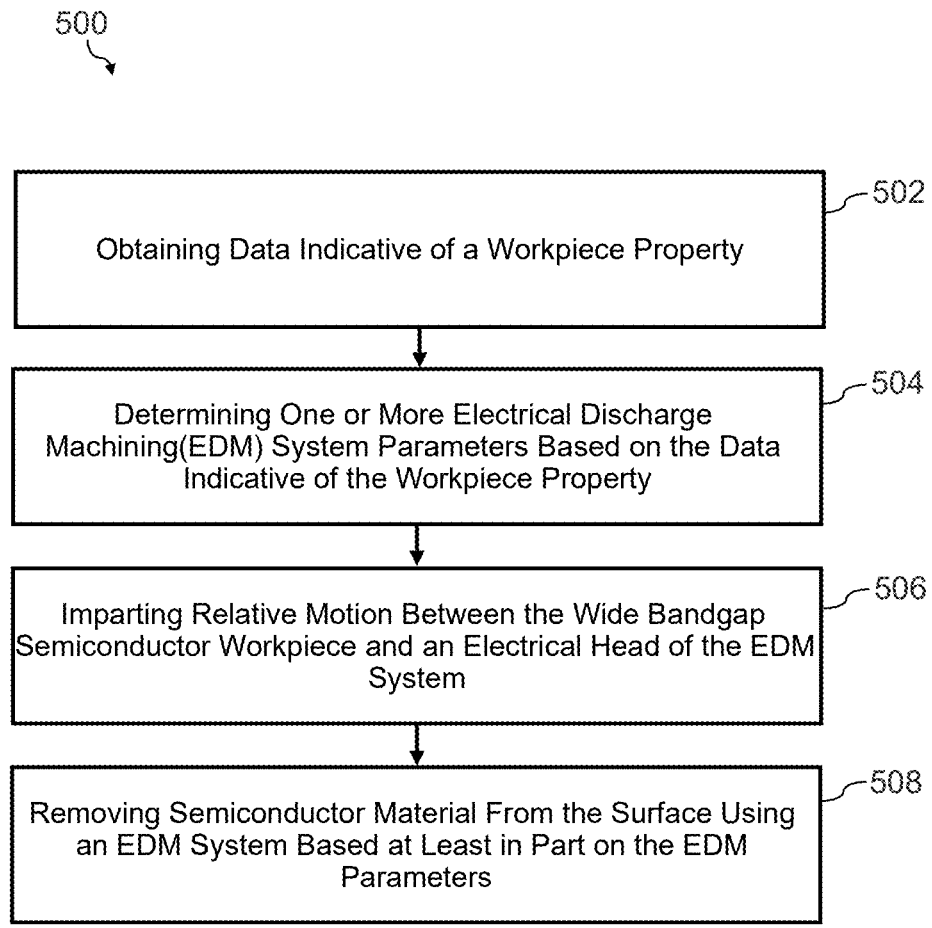
FIG. 12 depicts a flow chart diagram of an example method according to examples of the present disclosure.

FIG. 12 depicts a flow chart diagram of an example method 500 according to aspects of the present disclosure. The method 500 includes operations illustrated in a particular order for purposes of illustration and discussion. Those of ordinary skill in the art, using the disclosures provided herein, will understand that the various steps or operations of any of the method provided in this disclosure may be adapted, rearranged, omitted, include steps not illustrated, and/or modified in various ways without deviating from the scope of the present disclosure. The method 500 may be implemented, for example, as part of the EDM-based surface processing described at 408 in the method 400 of FIG. 11.

At 502, the method 500 includes obtaining workpiece property data associated with the workpiece. For instance, the workpiece property data may be obtained from one or more sensors. In some embodiments, the workpiece property data may be obtained by scanning the exposed surface with one or more surface measurement lasers. In some embodiments, the workpiece property data may be obtained from an optical sensor or image-capturing device (e.g., camera) and processing or analyzing the images (e.g., using digital image process techniques) obtained from the optical sensor or image-capturing device. The workpiece property data may be obtained in a variety of formats without deviating from the scope of the present disclosure.

At 504, the method 500 includes determining one or more EDM system parameters based on the workpiece property data. For instance, the method may include determining one or more of one or more of the duration of the electrical pulse supplied to the electrode head 308 of the EDM system 300, the current of the electrical pulse supplied to the electrode head 308 of the EDM system 300, scan pattern, and/or translation speed based on the workpiece property data. In some embodiments, the one or more EDM system parameters may be determined as a function of position on the surface.

At 506, the method 500 includes imparting relative motion between the surface and the electrode head. In some instances, imparting relative motion may be performed during other operations of the method 500. For example, imparting relative motion between the surface and the one or more electrode heads may be performed during the operation 508 described below. As an example, imparting relative motion between the electrode head and the surface may result in at least 85% of the surface, such as at least 95% of the surface, such as at least 99% of the surface being scanned by the electrode head. In some instances, imparting relative motion between the surface and the electrode head may include moving the surface relative to the electrode head. The inverse may also be true. In some instances, the electrode head may be moved relative to the surface.

At 508, the method 500 includes removing semiconductor material from the surface using an EDM system based at least in part on the one or more EDM system parameters as described in the present disclosure.

According to aspects of the present disclosure, the electrode head may scan the surface of a workpiece in any suitable pattern. The example scan patterns will be described below in the context of a semiconductor wafer 700. However, these scan patterns may be implemented with any other suitable semiconductor workpiece, such as a semiconductor boule.

FIG. 13 depicts an example scan pattern 704 on an example semiconductor wafer 700 (e.g., silicon carbide semiconductor wafer) according to example embodiments of the present disclosure. The scan pattern depicted in FIG. 13 includes a plurality of parallel scans or passes in a direction generally perpendicular to, for instance, a flat 702 of the semiconductor wafer 700.

FIG. 14 depicts an example scan pattern 706 on an example semiconductor wafer 700 (e.g., silicon carbide semiconductor wafer) according to example embodiments of the present disclosure. The scan pattern 706 depicted in FIG. 14 includes a spiral scan pattern on a surface of the semiconductor wafer 700.

FIG. 15 depicts an example scan pattern 708 on an example semiconductor wafer 700 (e.g., silicon carbide semiconductor wafer) according to example embodiments of the present disclosure. The scan pattern 708 depicted in FIG. 15 includes a plurality of generally parallel scans or passes in a direction that is angled (not generally perpendicular and not generally parallel) to, for instance, a flat 702 of the semiconductor wafer 700.

FIG. 16 depicts an example scan pattern 710 on an example semiconductor wafer 700 (e.g., silicon carbide semiconductor wafer) according to example embodiments of the present disclosure. The scan pattern 710 depicted in FIG. 16 includes a plurality of generally parallel scans or passes in a direction that is generally parallel to, for instance, a flat 702 of the semiconductor wafer 700.

FIG. 17 depicts an example scan pattern 712 on an example semiconductor wafer 700 (e.g., silicon carbide semiconductor wafer) according to example embodiments of the present disclosure. The scan pattern 712 depicted in FIG. 17 includes a plurality of generally parallel scans or passes and a plurality of generally perpendicular scans or passes to, for instance, a flat 702 of the semiconductor wafer 700.

Other suitable electrode head scan patterns may be used without deviating from the scope of the present disclosure. For instance, the electrode head scan pattern may be an irregular or a random scan pattern. As additional non-limiting examples, the electrode head scan pattern may be a spot pattern, non-continuous pattern, zig-zag pattern, herringbone pattern, chevron pattern, array of polygons, concentric circles, or other suitable pattern.

Figure 18:
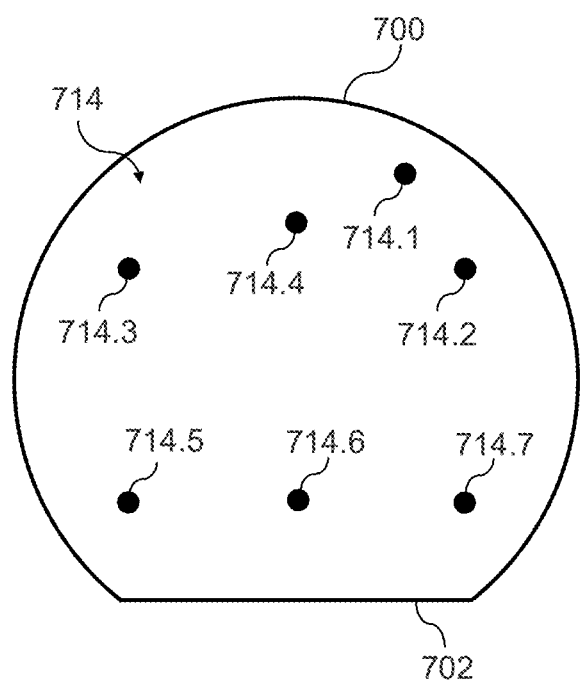

For instance, FIG. 18 depicts an example non-continuous scan pattern 714 on an example semiconductor wafer 700 (e.g., silicon carbide semiconductor wafer) according to example embodiments of the present disclosure. The scan pattern 714 depicted in FIG. 18 includes a plurality of discrete and separated scan points 714.1, 714.2, . . . 714.*n* on the semiconductor wafer 700. For instance, workpiece property data (e.g., sensor data associated with one or more workpiece properties) may indicate the presence of local peak topographical areas on the semiconductor wafer 700. The electrode head scan pattern 714 can provide exposure to the one or more electric discharges from the electrode head at discrete points 714.1, 714.2, . . . 714.*n* to remove the local peak topographical areas. The discrete points can be in a regular pattern or a scattered, irregular pattern.

Figure 19:
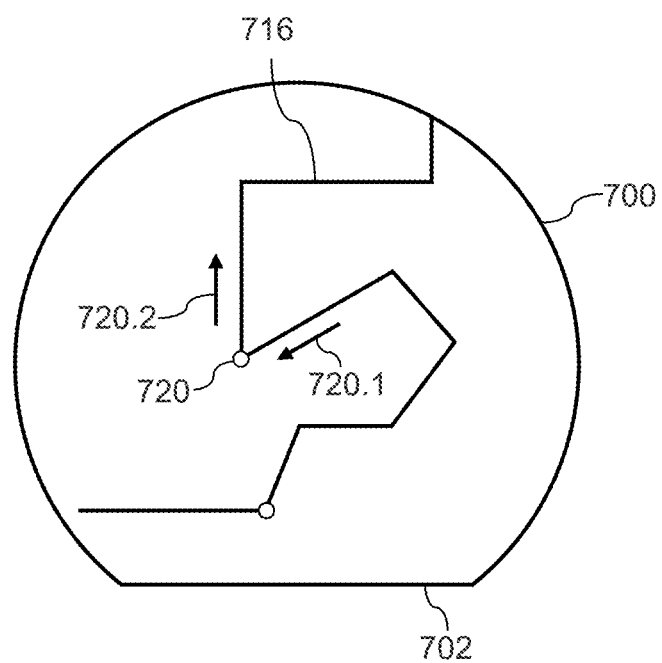

In some embodiments, the scan pattern may be adjusted (e.g., while scanning the semiconductor wafer) based on data, such as sensor data associated with one or more workpiece properties. For instance, FIG. 19 depicts an example scan pattern 718 on an example semiconductor wafer 700 (e.g., silicon carbide semiconductor wafer) according to example embodiments of the present disclosure. The scan pattern 718 has been adjusted, for instance, at point 720 from a first direction 720.1 to a second direction 720.2. In some embodiments, the scan pattern 718 may be adjusted, for instance, based on data associated with one or more workpiece properties. For instance, the scan pattern 718 may change directions to address high surface topographical areas (e.g., peaks) or other features on the surface of the semiconductor wafer 700. The scan pattern 718 may be adjusted based on other factors without deviating from the scope of the present disclosure.

FIG. 20 depicts an example EDM machine 800 according to examples of the present disclosure. The EDM machine 800 may be configured to implement one or more aspects of the present disclosure, such as the EDM-based removal processes and/or EDM-based surface processing operations disclosed herein.

The EDM machine 800 machine includes an electrode holder 802 and an electrode head 804 coupled to the electrode holder 802. The electrode head 804, in turn, can include an electrode 806. In this respect, the electrode holder 802 can support the electrode head 804 to position the electrode 806 relative to a semiconductor workpiece 818 (e.g., a semiconductor wafer or a semiconductor boule) such that a gap is defined between the electrode 806 and the semiconductor workpiece 818.

Additionally, the EDM machine 800 can include a servo motor 808 operable to move the electrode holder 802 (and, thus, the electrode head 804 and the electrode 806) relative to the semiconductor workpiece 818. Alternatively, or additionally, the servo motor 808 may be operable to rotationally drive the electrode 806 relative to the electrode holder 802 and/or the electrode head 804 (e.g., as indicated by arrow 826 in FIG. 20). Moreover, the servo motor 808 can maintain a constant gap between the electrode 806 and the semiconductor workpiece 818.

Furthermore, the EDM machine 800 includes an EDM generator 810. As shown, the EDM generator 810 can be electrically coupled to the electrode 806 via an electrical conduit 812. Moreover, the EDM generator 810 can be electrically coupled to a workpiece support 816 on which the semiconductor workpiece 818 is supported via an electrical conduit 814. As such, the EDM generator 810 can generate the voltage and/or electrical current flow necessary for creating one or more sparks in the gap defined between the electrode 806 and the workpiece 818.

In addition, the EDM machine 800 includes a pump 822. In general, the pump 822 is operable to pump or otherwise cause a dielectric fluid 820 to flow from a dielectric fluid supply to the electrode 806. Specifically, the pump 822 may be operable to pump the dielectric fluid 820 through a fluid conduit 824 (e.g., a pipe or hose) to the electrode 806. Thereafter, the dielectric fluid 820 can be discharged through and/or around the periphery of the electrode 806 for delivery to the semiconductor workpiece 818.

Example aspects of the present disclosure are set forth below. Any of the below features or examples may be used in combination with any of the embodiments or features provided in the present disclosure.

In an aspect, the present disclosure provides an example method. In some implementations, the example method includes providing a wide bandgap semiconductor workpiece. In some implementations, the example method includes exposing the wide bandgap semiconductor workpiece to one or more electrical discharges from an electrical discharge machining (EDM) system to reduce a surface roughness of the wide bandgap semiconductor workpiece.

In some implementations of the example method, the wide bandgap semiconductor workpiece is a semiconductor wafer.

In some implementations of the example method, the wide bandgap semiconductor workpiece is a semiconductor boule.

In some implementations of the example method, exposing the wide bandgap semiconductor workpiece to the one or more electrical discharges includes submerging a surface of the wide bandgap semiconductor workpiece in a dielectric fluid. In some implementations of the example method, exposing the wide bandgap semiconductor workpiece to the one or more electrical discharges includes positioning an electrode head relative to the surface such that a gap is defined between an end of the electrode head and the surface. In some implementations of the example method, exposing the wide bandgap semiconductor workpiece to the one or more electrical discharges includes generating an electrical discharge across the gap to create a plasma zone within the gap such that a material is removed from the surface.

In some implementations of the example method, the dielectric fluid includes an oil, kerosene, paraffin, deionized water, or white spirit.

In some implementations of the example method, generating the electrical discharge includes applying a potential difference between the electrode head and the wide bandgap semiconductor workpiece.

In some implementations of the example method, exposing the wide bandgap semiconductor workpiece to the one or more electrical discharges includes imparting relative motion between the wide bandgap semiconductor workpiece and an electrode head of the EDM system.

In some implementations of the example method, the example method includes removing the portion of the semiconductor boule using the removal process to form the wide bandgap semiconductor workpiece before exposing the wide bandgap semiconductor workpiece to the one or more electrical discharge In some implementations of the example method, removing the portion of the semiconductor boule using the removal process comprises removing a semiconductor wafer from the semiconductor boule using a laser-based removal process.

In some implementations of the example method, the laser-based removal process includes inducing a subsurface laser damage region in the semiconductor boule and separating the semiconductor wafer from the semiconductor boule along the subsurface laser damage region In some implementations of the example method, exposing the wide bandgap semiconductor workpiece to the one or more electrical discharges results in a surface having a surface roughness Ra in a range of about 120 nm to about 65 microns.

In some implementations of the example method, exposing the wide bandgap semiconductor workpiece to the one or more electrical discharges includes removing material from a surface of the wide bandgap semiconductor workpiece to reduce a thickness of the wide bandgap semiconductor workpiece by at least about 25 microns or greater.

In some implementations of the example method, exposing the wide bandgap semiconductor workpiece to the one or more electrical discharges includes removing material from the surface of the wide bandgap semiconductor workpiece to reduce the thickness of the wide bandgap semiconductor workpiece by about 25 microns to about 100 microns.

In some implementations of the example method, exposing the wide bandgap semiconductor workpiece to the one or more electrical discharges includes obtaining data indicative of a workpiece property. In some implementations of the example method, exposing the wide bandgap semiconductor workpiece to the one or more electrical discharges includes determining one or more EDM system parameters based on the data indicative of the workpiece property. In some implementations of the example method, exposing the wide bandgap semiconductor workpiece to the one or more electrical discharges includes exposing the wide bandgap semiconductor workpiece to the one or more electrical discharges based at least in part on the one or more EDM system parameters.

In some implementations of the example method, the data indicative of the workpiece property includes a surface topography of a surface of the wide bandgap semiconductor workpiece.

In some implementations of the example method, the data indicative of the workpiece property is obtained from an optical sensor.

In some implementations of the example method, the data indicative of the workpiece property is obtained from one or more surface measurement lasers.

In some implementations of the example method, the data indicative of the workpiece property includes an image.

In some implementations of the example method, the one or more EDM system parameters include one or more of a duration of an electrical pulse supplied to an electrode head of the EDM system, a current of an electrical pulse supplied to the electrode head, or a translation speed of relative motion between the electrode head and a surface of the wide bandgap semiconductor workpiece.

In some implementations of the example method, the one or more EDM system parameters are specified as a function of position on a surface of the wide bandgap semiconductor workpiece.

In some implementations of the example method, the wide bandgap semiconductor workpiece includes silicon carbide.

In some implementations of the example method, the wide bandgap semiconductor workpiece includes a Group III-nitride.

In an aspect, the present disclosure provides an example method of processing a surface of a semiconductor material. In some implementations, the example method includes obtaining data indicative of a workpiece property. In some implementations, the example method includes determining one or more electrical discharge machining (EDM) system parameters based on the data indicative of the workpiece property. In some implementations, the example method includes removing semiconductor material from the surface using an EDM system based at least in part on the EDM system parameters.

In some implementations of the example method, the data indicative of the workpiece property includes a surface topography of the surface.

In some implementations of the example method, the data indicative of the workpiece property is obtained from an optical sensor.

In some implementations of the example method, the data indicative of the workpiece property is obtained from one or more surface measurement lasers.

In some implementations of the example method, the data indicative of the workpiece property includes an image.

In some implementations of the example method, the one or more EDM system parameters include one or more of a duration of an electrical pulse supplied to an electrode head of the EDM system, a current of an electrical pulse supplied to the electrode head, or a translation speed of relative motion between the electrode head and the surface.

In some implementations of the example method, the one or more EDM system parameters are specified as a function of position on the surface.

In some implementations of the example method, the surface is a surface of a semiconductor wafer.

In some implementations of the example method, the surface is a surface of a semiconductor boule.

In some implementations of the example method, the semiconductor material includes a wide bandgap semiconductor.

In some implementations of the example method, the semiconductor material includes silicon carbide.

In some implementations of the example method, the semiconductor material includes a Group III-nitride.

In an aspect, the present disclosure provides an example method of processing a semiconductor workpiece. In some implementations, the example method includes submerging a surface of a semiconductor workpiece in a dielectric fluid. In some implementations, the example method includes positioning an electrode head of an electric discharge machining (EDM) system relative to the surface such that a gap is defined between an end of the electrode head and the surface. In some implementations, the example method includes generating an electrical discharge across the gap to create a plasma zone within the gap such that semiconductor material is removed from the surface.

In some implementations of the example method, the dielectric fluid has a conductivity in a range of about 0.1 µS/cm to about 1 µS/cm.

In some implementations of the example method, positioning the electrode head relative to the surface includes positioning an electrode of the electrode head relative to the surface such that the gap is defined between an end of the electrode and the surface.

In some implementations of the example method, generating the electrical discharge includes applying a potential difference between an electrode of the electrode head and the semiconductor workpiece.

In some implementations of the example method, the example method further includes imparting relative motion between the semiconductor workpiece and the electrode head.

In some implementations of the example method, the semiconductor workpiece is a semiconductor wafer.

In some implementations of the example method, the semiconductor workpiece is a semiconductor boule.

In some implementations of the example method, the semiconductor material includes a wide bandgap semiconductor.

In some implementations of the example method, the semiconductor workpiece includes silicon carbide.

In some implementations of the example method, the semiconductor workpiece includes a Group III-nitride.

In an aspect, the present disclosure provides an example system for processing a surface of a semiconductor material. In some implementations, the example system includes an electrical discharge machining (EDM) system. In some implementations, the example electrical discharge machining (EDM) system includes a tank operable to contain a dielectric fluid and a semiconductor workpiece submerged within the dielectric fluid. In some implementations, the example electrical discharge machining (EDM) system includes an electrode head operable to be positioned relative to a surface of the semiconductor workpiece such that a gap is defined between an end of the electrode head and the surface. In some implementations, when a bias voltage is supplied to the electrode head, an electrical discharge is generated across the gap and a plasma zone is created within the gap that removes material from the surface. In some implementations, the example electrical discharge machining (EDM) system includes a translation stage operable to impart relative motion between the electrode head and the surface of the semiconductor workpiece.

In some implementations, the example system includes a sensor operable to obtain data indicative of a workpiece property of the surface. In some implementations, the example system includes a controller configured to perform operations. In some implementations of the example system, the operations include determining one or more EDM system parameters based on the data indicative of the workpiece property. In some implementations of the example system, the operations include controlling the EDM system to remove material from the surface based at least in part on the EDM system parameters.

In some implementations of the example system, the data indicative of the workpiece property includes a surface topography of the surface.

In some implementations of the example system, the sensor is an optical sensor.

In some implementations of the example system, the sensor is a surface measurement laser.

In some implementations of the example system, the sensor is an image capture device.

In some implementations of the example system, the one or more EDM system parameters include one or more of a duration of an electrical pulse supplied to the electrode head, a current of an electrical pulse supplied to the electrode head, or a translation speed of relative motion between the electrode head and the surface.

In some implementations of the example system, the one or more EDM system parameters are specified as a function of position on the surface.

In some implementations of the example system, the semiconductor workpiece is a semiconductor wafer.

In some implementations of the example system, the semiconductor workpiece is a semiconductor boule.

In some implementations of the example system, the surface is a surface of the semiconductor boule from which a wafer was removed.

In some implementations of the example system, the surface is a surface of the semiconductor boule from which a seed end of the semiconductor boule or a dome end of the semiconductor boule was removed.

In some implementations of the example system, the electrode head is operable to remove the material from the surface such that, after the material is removed, the surface has a surface roughness Ra in a range of about 120 nm to about 65 microns.

In some implementations of the example system, the electrode head is operable to remove the material from the surface such that, after the material is removed, a thickness of the semiconductor workpiece is reduced by about 25 microns to about 100 microns.

While the present subject matter has been described in detail with respect to specific example embodiments thereof, it will be appreciated that those skilled in the art, upon attaining an understanding of the foregoing may readily produce alterations to, variations of, and equivalents to such embodiments. Accordingly, the scope of the present disclosure is by way of example rather than by way of limitation, and the subject disclosure does not preclude inclusion of such modifications, variations and/or additions to the present subject matter as would be readily apparent to one of ordinary skill in the art.

What is claimed is:

1. A method, comprising:
   removing a portion of a semiconductor boule using a removal process to form a wide bandgap semiconductor workpiece; and
   exposing the wide bandgap semiconductor workpiece to one or more electrical discharges from an electrical discharge machining (EDM) system after the removal process to remove material from an exposed surface of the wide bandgap semiconductor workpiece.

2. The method of claim 1, wherein the wide bandgap semiconductor workpiece is a semiconductor wafer.

3. The method of claim 1, wherein the wide bandgap semiconductor workpiece is a semiconductor boule.

4. The method of claim 1, wherein exposing the wide bandgap semiconductor workpiece to the one or more electrical discharges comprises:
   submerging a surface of the wide bandgap semiconductor workpiece in a dielectric fluid;
   positioning an electrode head relative to the surface such that a gap is defined between an end of the electrode head and the surface; and
   generating an electrical discharge across the gap to create a plasma zone within the gap such that a material is removed from the surface.

5. The method of claim 4, wherein the dielectric fluid comprises an oil, kerosene, paraffin, deionized water, or white spirit.

6. The method of claim 4, wherein generating the electrical discharge comprises applying a potential difference between the electrode head and the wide bandgap semiconductor workpiece.

7. The method of claim 1, wherein removing the portion of the semiconductor boule using the removal process comprises removing a semiconductor wafer from the semiconductor boule using a laser-based removal process.

8. The method of claim 7, wherein the laser-based removal process comprises:
   inducing a subsurface laser damage region in the semiconductor boule; and
   separating the semiconductor wafer from the semiconductor boule along the subsurface laser damage region.

9. The method of claim 1, wherein exposing the wide bandgap semiconductor workpiece to the one or more electrical discharges results in a surface having a surface roughness Ra in a range of about 120 nm to about 65 microns.

10. The method of claim 1, wherein exposing the wide bandgap semiconductor workpiece to the one or more electrical discharges comprises removing material from a surface of the wide bandgap semiconductor workpiece to reduce a thickness of the wide bandgap semiconductor workpiece by at least about 25 microns or greater.

11. The method of claim 1, wherein exposing the wide bandgap semiconductor workpiece to the one or more electrical discharges comprises:
   obtaining data indicative of a workpiece property;
   determining one or more EDM system parameters based on the data indicative of the workpiece property; and
   exposing the wide bandgap semiconductor workpiece to the one or more electrical discharges based at least in part on the one or more EDM system parameters.

12. The method of claim 11, wherein the data indicative of the workpiece property comprises a surface topography of a surface of the wide bandgap semiconductor workpiece.

13. The method of claim 11, wherein the data indicative of the workpiece property is obtained from an optical sensor.

14. The method of claim 11, wherein the data indicative of the workpiece property is obtained from one or more surface measurement lasers.

15. The method of claim 11, wherein the one or more EDM system parameters comprise one or more of a duration of an electrical pulse supplied to an electrode head of the EDM system, a current of an electrical pulse supplied to the electrode head, or a translation speed of relative motion between the electrode head and a surface of the wide bandgap semiconductor workpiece.

16. The method of claim 11, wherein the one or more EDM system parameters are specified as a function of position on a surface of the wide bandgap semiconductor workpiece.

17. A method of processing a semiconductor workpiece, the method comprising:
- removing a portion of a semiconductor boule using a removal process to form a wide bandgap semiconductor workpiece;
- submerging a surface of a semiconductor workpiece in a dielectric fluid;
- positioning an electrode head of an electric discharge machining (EDM) system relative to the surface such that a gap is defined between an end of the electrode head and the surface; and
- generating an electrical discharge across the gap to create a plasma zone within the gap such that semiconductor material is removed from the surface after removing the portion of the semiconductor boule to form the wide bandgap semiconductor workpiece.

18. The method of claim 17, wherein the dielectric fluid has a conductivity in a range of about 0.1 µS/cm to about 1 µS/cm.

19. The method of claim 17, wherein positioning the electrode head relative to the surface comprises positioning an electrode of the electrode head relative to the surface such that the gap is defined between an end of the electrode and the surface.

* * * * *